(12) United States Patent
Kurahashi

(10) Patent No.: US 9,647,105 B2
(45) Date of Patent: May 9, 2017

(54) SEMICONDUCTOR DEVICE AND METHOD OF MANUFACTURING THE SAME

(71) Applicant: FUJITSU LIMITED, Kawasaki-shi, Kanagawa (JP)

(72) Inventor: Naoko Kurahashi, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/511,313

(22) Filed: Oct. 10, 2014

(65) Prior Publication Data

US 2015/0129887 A1    May 14, 2015

(30) Foreign Application Priority Data

Nov. 12, 2013  (JP) .................................. 2013-234170

(51) Int. Cl.
*H01L 29/15* (2006.01)
*H01L 21/332* (2006.01)
(Continued)

(52) U.S. Cl.
CPC .... *H01L 29/7787* (2013.01); *H01L 29/42316* (2013.01); *H01L 29/42364* (2013.01);
(Continued)

(58) Field of Classification Search
CPC ... H01L 21/76886; H01L 22/14; H01L 27/24; H01L 27/26; H01L 27/3279; H01L 27/329; H01L 45/04; H01L 2924/30101
(Continued)

(56) References Cited

U.S. PATENT DOCUMENTS

2004/0144991 A1  7/2004  Kikkawa
2008/0087916 A1  4/2008  Amasuga et al.
(Continued)

FOREIGN PATENT DOCUMENTS

CN  102651393 A  8/2012
CN  103035683 A  4/2013
(Continued)

OTHER PUBLICATIONS

Office Action of corresponding Taiwanese Patent Application No. 103135838 dated Nov. 8, 2016. English Summary of TWOA based on cited reference.
Japanese Patent Application No. 2013-234170: Notification of Reasons for Refusal dated Mar. 7, 2017.
Japanese Patent Application No. 2013-234170: Notification of Reasons for Refusal dated Mar. 2, 2017.
Chinese Patent Application No. 201410609736: First Office Action dated Feb. 4, 2017.

*Primary Examiner* — Julio J Maldonado
*Assistant Examiner* — Moin Rahman
(74) *Attorney, Agent, or Firm* — Kratz, Quintos & Hanson, LLP

(57) ABSTRACT

A semiconductor device includes: a substrate; nitride semiconductor layers disposed over the substrate; a source electrode and a drain electrode disposed over the nitride semiconductor layers; a first insulating layer disposed over the nitride semiconductor layers, the source electrode and the drain electrode; a second insulating layer disposed over the first insulating layer; a first opening disposed in the second insulating layer and the first insulating layer and between the source electrode and the drain electrode, a portion of the nitride semiconductor layer being exposed in the first opening; a second opening disposed in the second insulating layer and between the source electrode and the drain electrode, a portion of the first insulating layer being exposed in the second opening; and a gate electrode disposed over the second insulating layer to bury the first opening and at least a portion of the second opening.

9 Claims, 27 Drawing Sheets

(51) Int. Cl.
*H01L 29/778* (2006.01)
*H01L 29/66* (2006.01)
*H01L 29/51* (2006.01)
*H01L 29/423* (2006.01)
*H01L 29/20* (2006.01)

(52) U.S. Cl.
CPC .......... *H01L 29/513* (2013.01); *H01L 29/518* (2013.01); *H01L 29/66462* (2013.01); *H01L 29/2003* (2013.01); *H01L 2224/0603* (2013.01); *H01L 2224/48247* (2013.01); *H01L 2224/48257* (2013.01); *H01L 2224/4903* (2013.01); *H01L 2924/181* (2013.01)

(58) Field of Classification Search
USPC .......... 257/20, 194, 135–136, 213–413, 900, 257/902–903; 438/136, 137, 156, 173, 438/192, 206, 212, 424, 427, 428, 591
See application file for complete search history.

(56) References Cited

U.S. PATENT DOCUMENTS

| | | | |
|---|---|---|---|
| 2012/0126287 A1 | 5/2012 | Aoki | |
| 2012/0138944 A1* | 6/2012 | Kanamura | H01L 29/66462 257/66 |
| 2012/0220089 A1* | 8/2012 | Imada | H01L 29/0619 438/270 |
| 2013/0082400 A1* | 4/2013 | Ohki | H01L 29/66462 257/774 |

FOREIGN PATENT DOCUMENTS

| | | |
|---|---|---|
| JP | 2002-359256 A1 | 12/2002 |
| JP | 2008-098400 A | 4/2008 |
| JP | 2012-109492 A | 6/2012 |
| JP | 2012-256923 A1 | 12/2012 |
| JP | 2013-77629 A1 | 4/2013 |

\* cited by examiner

SEMICONDUCTOR DEVICE AND METHOD OF MANUFACTURING THE SAME

CROSS-REFERENCE TO RELATED APPLICATION

This application is based upon and claims the benefit of priority of the prior Japanese Patent Application No. 2013-234170, filed on Nov. 12, 2013, the entire contents of which are incorporated herein by reference.

FIELD

The embodiments discussed herein are related to semiconductor device and their manufacturing the method.

BACKGROUND

Nitride semiconductors such as GaN, AlN and InN, as well as mixed crystals thereof have wide band gap and are used in devices such as high-power electronic devices or short-wavelength emitting devices. For example, the nitride semiconductor GaN has a band gap of 3.4 eV, which is larger than the band gap of Si (1.1 eV) or the band gap of GaAs (1.4 eV).

Examples of such high-power electronic devices are field effect transistors (FETs), in particular, high electron mobility transistors (HEMTs). The HEMTs including nitride semiconductors are used in, for example, high-power high-efficiency amplifiers and high-power switching devices. Specifically, in HEMTs having an AlGaN electron supply layer and a GaN electron transit layer, phenomena such as piezopolarization occur in AlGaN due to the strain ascribed to the difference in lattice constant between AlGaN and GaN, resulting in the generation of a dense two-dimensional electron gas (2DEG). By virtue of this, operations at high voltage are feasible and the HEMTs may be used in high-efficiency switching elements and high-voltage power devices in, for example, electric vehicles.

In a semiconductor device with a structure in which a gate electrode is disposed on a nitride semiconductor such as an electron supply layer, an electric field is concentrated at an end portion of the gate electrode on the drain electrode side and this field concentration may result in problems such as the breakage of the semiconductor device.

Thus, semiconductor devices are desired which have a structure that reduces the concentration of an electric field at an end portion of a gate electrode on the drain electrode side and thereby reduces the occurrence of problems such as the breakage of the semiconductor device.

The following are reference documents:
[Document 1] Japanese Laid-open Patent Publication No. 2002-359256,
[Document 2] Japanese Laid-open Patent Publication No. 2012-256923, and
[Document 3] Japanese Laid-open Patent Publication No. 2013-77629.

SUMMARY

According to an aspect of the invention, a semiconductor device includes: a substrate; nitride semiconductor layers disposed over the substrate; a source electrode and a drain electrode disposed over the nitride semiconductor layers; a first insulating layer disposed over the nitride semiconductor layers, the source electrode and the drain electrode; a second insulating layer disposed over the first insulating layer; a first opening disposed in the second insulating layer and the first insulating layer and between the source electrode and the drain electrode, a portion of the nitride semiconductor layer being exposed in the first opening; a second opening disposed in the second insulating layer and between the source electrode and the drain electrode, a portion of the first insulating layer being exposed in the second opening; and a gate electrode disposed over the second insulating layer to bury the first opening and at least a portion of the second opening.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
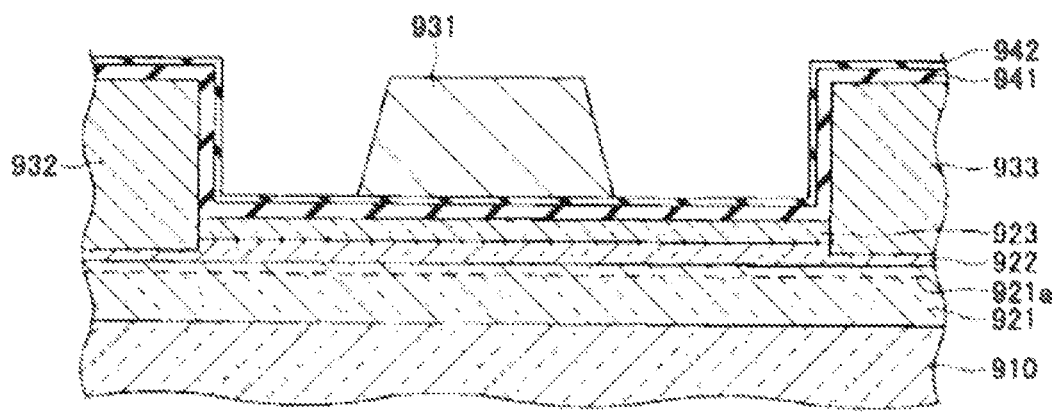
FIG. 1 is a view (1) illustrating a structure of a conventional semiconductor device.

Hereinafter, embodiments are described. Identical members and configurations are assigned with the same reference numerals and are not described anew.

First Embodiment

First, the concentration of an electric field at an end portion of a gate electrode on the drain electrode side will be described. Specifically, the concentration of an electric field at an end portion of a gate electrode on the drain electrode side will be described based on semiconductor devices having structures illustrated in FIGS. 1 to 3. In these semiconductor devices, an insulating layer as a gate insulating film is disposed on a nitride semiconductor layer for purposes such as improving the voltage resistance.

In the semiconductor device illustrated in FIG. 1, layers such as a buffer layer, which are not illustrated, are disposed on a substrate 910 such as silicon. An electron transit layer 921 made of GaN, an electron supply layer 922 made of AlGaN, and a cap layer 923 made of GaN are stacked on the buffer layer. As a result, a 2DEG 921a is generated in the electron transit layer 921 near the interface between the electron transit layer 921 and the electron supply layer 922. The cap layer 923 has been removed from the regions where a source electrode 932 and a drain electrode 933 will be formed, and the source electrode 932 and the drain electrode 933 are formed on the electron supply layer 922 exposed by the removal of the cap layer 923. Further, a SiN film 941 as a first insulating layer and a SiON film 942 as a second insulating layer are stacked on the cap layer 923, and a gate electrode 931 is disposed on the SION film 942 serving as the second insulating layer. In this semiconductor device, the film thickness of the SiN film 941 as the first insulating layer is approximately 40 nm, and the film thickness of the SiON film 942 as the second insulating layer is approximately 20 nm.

Figure 2:
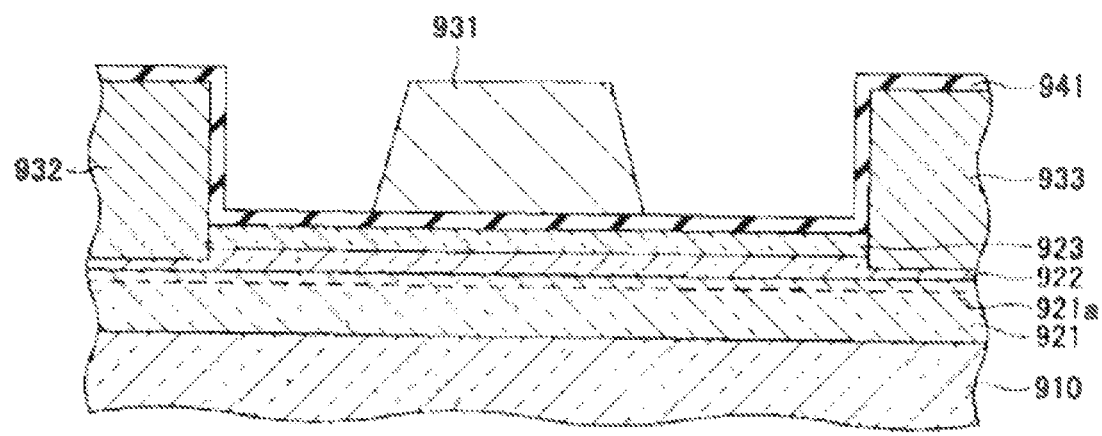
FIG. 2 is a view (2) illustrating a structure of a conventional semiconductor device.

The semiconductor device illustrated in FIG. 2 has the same structure as the semiconductor device of FIG. 1, except that a SiN film as a first insulating layer alone is formed. In detail, a SiN film 941 alone is disposed on a cap layer 923, and a gate electrode 931 is disposed on the SiN film 941. In this semiconductor device, the film thickness of the SiN film 941 is approximately 40 nm. The semiconductor devices illustrated in FIG. 1 and the semiconductor devices illustrated in FIG. 2 are generally called metal-insulator-semiconductor (MIS) structures.

The semiconductor device illustrated in FIG. 3 corresponds to the semiconductor device of FIG. 1, except that portions of a SiON film 942 and a SiN film 941 immediately below a gate electrode 931 are removed to form an opening 942b. Consequently, the gate electrode 931 is in contact with a cap layer 923 exposed through the opening 942b. This semiconductor device is generally called a Schottky semiconductor device. In order to reduce the concentration of an electric field in the semiconductor device with the structure illustrated in FIG. 3, the SiON film 942 as the second insulating layer and the SiN film 941 as the first insulating layer are removed such that the opening 942b is tapered with the diameter upwardly increasing from the substrate 910 side.

Figure 3:
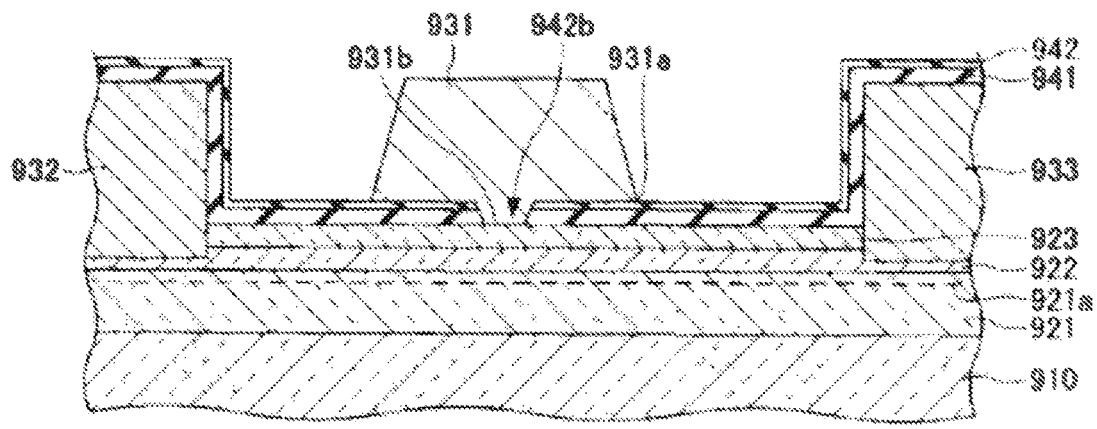
FIG. 3 is a view (3) illustrating a structure of a conventional semiconductor device.
Figure 4:
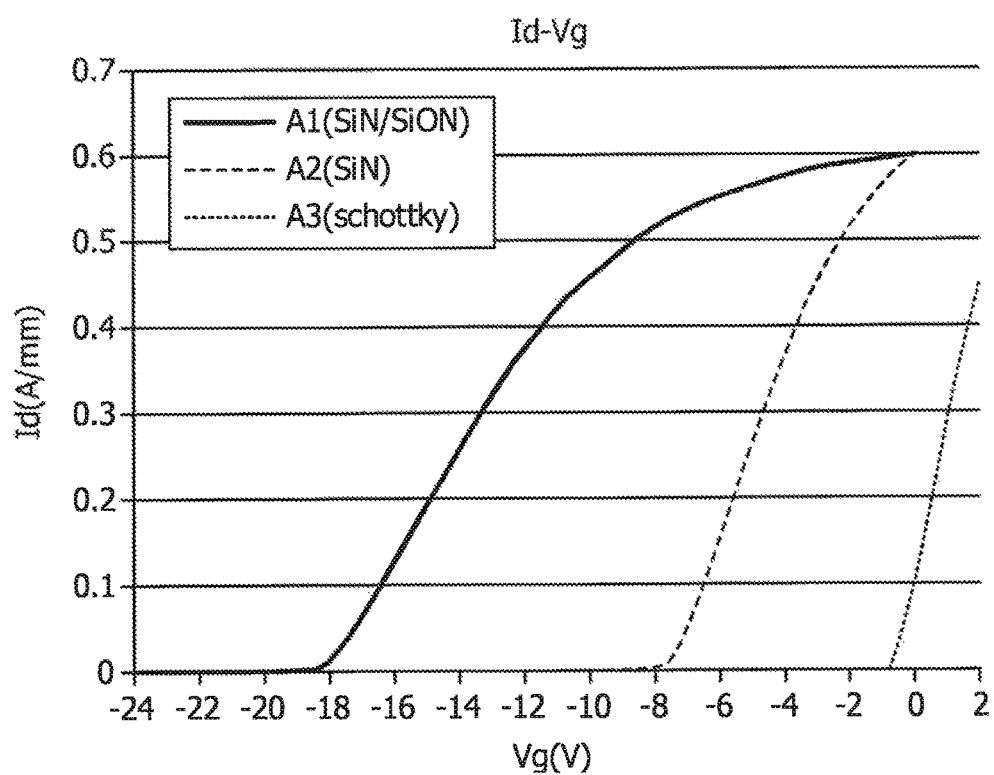
FIG. 4 is a diagram illustrating correlations between the gate voltage Vg and the drain current Id in conventional semiconductor devices.

FIG. 4 illustrates the results of a measurement in which semiconductor devices with the structures depicted in FIGS. 1 to 3 were tested to determine the relationship between the gate voltage Vg and the drain current Id, namely, to determine Id-Vg characteristics. In FIG. 4, A1 indicates the Id-Vg characteristics of a semiconductor device with the structure illustrated in FIG. 1, A2 indicates the Id-Vg characteristics of a semiconductor device with the structure illustrated in FIG. 2, and A3 indicates the Id-Vg characteristics of a semiconductor device with the structure illustrated in FIG. 3.

As indicated by A1, the gate threshold voltage of the semiconductor device with the structure illustrated in FIG. 1 is approximately −18 V. As indicated by A2, the gate threshold voltage of the semiconductor device with the structure illustrated in FIG. 2 is approximately −8 V. Thus, the absence of the SiON film 942 causes the gate threshold voltage to shift to the positive side as compared to when the SiON film 942 is present. As indicated by A3, the gate threshold voltage of the semiconductor device with the structure illustrated in FIG. 3 is approximately −0.8 V. Thus, the Schottky configuration in which the gate electrode 931 is in contact with the cap layer 923 results in a greater shift of the gate threshold voltage toward the positive side as compared to the MIS structure in which an insulating layer such as a SiN film is disposed between the cap layer 923 and the gate electrode 931.

Figure 5:
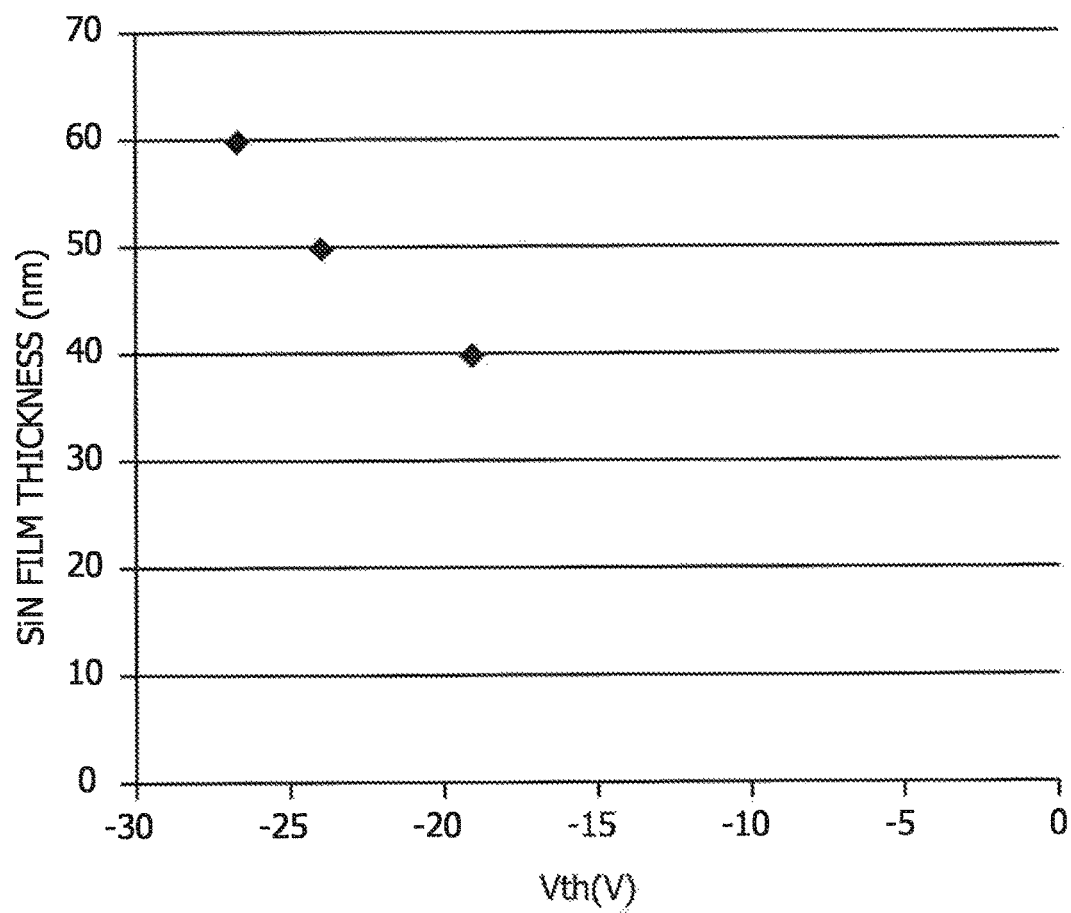
FIG. 5 is a diagram illustrating a correlation between the film thickness of a SiN film and the gate threshold voltage Vth in the semiconductor device depicted in FIG. 1.

FIG. 5 illustrates a relationship between the film thickness of the SiN film 941 and the gate threshold voltage Vth in a semiconductor device with the structure depicted in FIG. 1. As illustrated in FIG. 5, the gate threshold voltage Vth is lowered and shifts in the negative direction with increasing film thickness of the SiN film 941.

In the semiconductor device with the structure illustrated in FIG. 3, the gate threshold voltage is approximately −0.8 V. Consequently, an electric field tends to be concentrated at an end portion 931a of the gate electrode 931 on the drain electrode 933 side, and the semiconductor device may be broken easily. That is, the semiconductor device illustrated in FIG. 3 has a large difference in gate threshold voltage between a Schottky connection portion 931b of the gate electrode 931 in contact with the cap layer 923, and the end portion 931a on the drain electrode 933 side on the SiN film 941 and the SiON film 942. As a result, the drain voltage causes an electric field to be concentrated at the end portion 931a of the gate electrode 931 on the drain electrode 933 side, and an electric field stress is applied due to the presence of the SiN film 941 and the SiON film 942. Consequently, the semiconductor device may be broken easily at regions such as the end portion 931a of the gate electrode 931 on the drain electrode 933 side. That is, the reliability and the life of the semiconductor devices are deteriorated.

(Semiconductor Devices)

Figure 6:
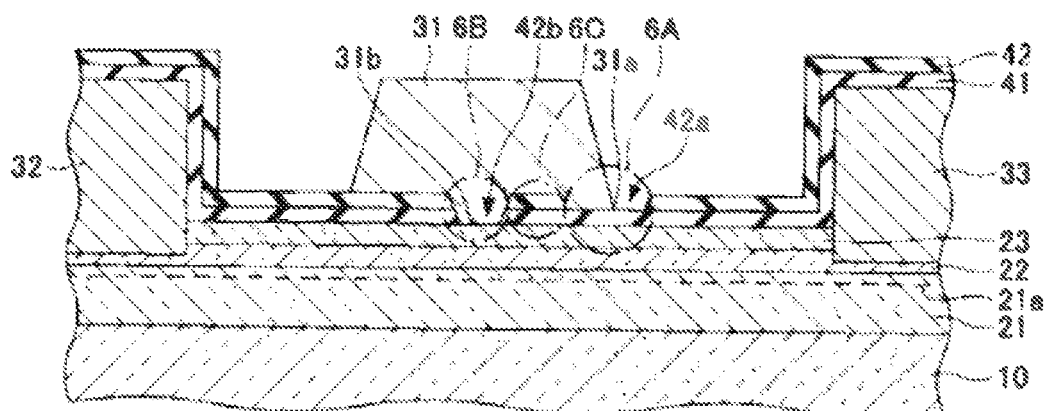
FIG. 6 is a view illustrating a structure of a semiconductor device in a first embodiment.

Next, semiconductor devices in the present embodiment will be described. In the semiconductor device in this embodiment, as illustrated in FIG. 6, layers such as a buffer layer, which are not illustrated, are disposed on a substrate 10, and an electron transit layer 21, an electron supply layer 22, and a cap layer 23 are sequentially stacked on the buffer layer. As a result, a 2DEG 21*a* is generated in the electron transit layer 21 near the interface between the electron transit layer 21 and the electron supply layer 22. The substrate 10 is made of such a material as silicon (Si), silicon carbide (SIC) or sapphire ($Al_2O_3$). The buffer layer, which is not illustrated, is a film including, for example, AlN. The electron transit layer 21 is made of GaN, the electron supply layer 22 is made of AlGaN, and the cap layer 23 is made of GaN. In this embodiment, the electron transit layer 21, the electron supply layer 22, and the cap layer 23 are sometimes written as the first semiconductor layer, the second semiconductor layer, and the third semiconductor layer, respectively.

The cap layer 23 has been removed from the regions where a source electrode 32 and a drain electrode 33 are disposed, and the source electrode 32 and the drain electrode 33 are formed on the electron supply layer 22 exposed by the removal of the cap layer 23. Further, a first insulating layer 41 including SiN and a second insulating layer 42 including SiON are stacked on the cap layer 23. The first insulating layer 41 and the second insulating layer 42 are formed of materials including any of, for example, SiN, SiON, $SiO_2$, AlN, $Al_2O_3$ and $Ta_2O_5$. The first insulating layer 41 and the second insulating layer 42 are preferably made of different materials. Further, the first insulating layer 41 is preferably made of a nitride and the second insulating layer 42 is preferably made of an oxide or an oxynitride.

In the region where a gate electrode 31 is disposed, the second insulating layer 42 has been locally removed to form an opening 42*a* in an area enclosed by an alternate long and short dash line 6A on which an end portion 31*a* of the gate electrode 31 on the drain electrode 33 side is disposed. As a result, only the first insulating layer 41 remains in this area. Thus, the whole insulating layer composed of the first insulating layer 41 and the second insulating layer 42 has a smaller thickness in the region where the opening 42*a* is disposed than the other regions excluding the opening 42*a* and an opening 42*b*.

In a central area enclosed by an alternate long and short dash line 6B, the first insulating layer 41 and the second insulating layer 42 have been removed such that the opening 42*b* is tapered with the diameter upwardly increasing from the substrate 10 side. This taper with a diameter upwardly increasing from the substrate 10 side will be also written as a forward taper. While, in this embodiment, the opening 42*b* is described as being disposed in the central area of the region where the gate electrode 31 is disposed, the opening 42*b* may be located elsewhere more inside than the opening 42*a* in the region where the gate electrode 31 is disposed.

In the region between the opening 42*a* and the central opening 42*b* that is enclosed by an alternate long and short dash line 6C, the gate electrode 31 is disposed on the stack of the first insulating layer 41 and the second insulating layer 42.

Thus, in the present embodiment, the end portion 31*a* of the gate electrode 31 on the drain electrode 33 side is disposed on the first insulating layer 41 in the opening 42*a*. Further, the gate electrode 31 is disposed on the cap layer 23 in the opening 42*b* that has been exposed by the removal of the first insulating layer 41 and the second insulating layer 42. This portion of the gate electrode 31 that is disposed on the cap layer 23 will be sometimes written as the Schottky connection portion 31*b*.

In this embodiment, the above configuration makes it possible to increase the threshold voltage in the end portion 31*a* of the gate electrode 31 on the drain electrode 33 side and thereby to reduce the concentration of an electric field at the end portion 31*a* of the gate electrode 31 on the drain electrode 33 side. In the region enclosed by the alternate long and short dash line 6C that lies between the opening 42*a* accommodating the end portion 31*a* of the gate electrode 31 on the drain electrode 33 side, and the central opening 42*b*, the gate electrode 31 is disposed on the second insulating layer 42 for purposes such as increasing the voltage resistance and reducing the leak current.

(Semiconductor Device Manufacturing Method)

Next, a method for manufacturing the semiconductor device in this embodiment will be described based on FIGS. 7A to 9B.

Figure 7A:
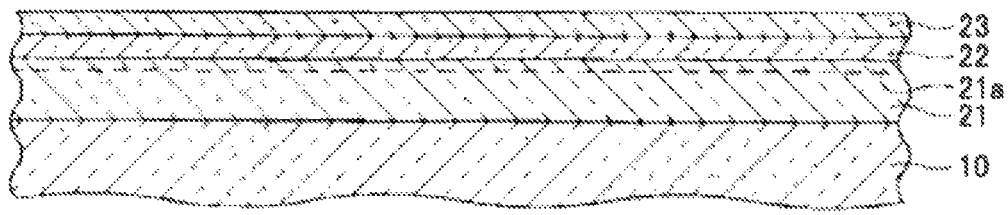
FIGS. 7A to 7C are views (1) illustrating steps in a method for manufacturing the semiconductor device in the first embodiment.

First, as illustrated in FIG. 7A, a buffer layer, which is not illustrated, is formed on a substrate 10 and, on the buffer layer formed, an electron transit layer 21, an electron supply layer 22 and a cap layer 23 are sequentially formed by epitaxial growth. In this embodiment, the buffer layer, which is not illustrated, the electron transit layer 21, the electron supply layer 22 and the cap layer 23 are epitaxially grown by metal organic vapor phase epitaxy (MOVPE). The substrate 10 used herein is a silicon substrate, and the buffer layer, which is not illustrated, is a film including, for example, AlN. The electron transit layer 21 is made of GaN, the electron supply layer 22 is made of AlGaN, and the cap layer 23 is made of GaN. As a result, a 2DEG 21*a* is generated in the electron transit layer 21 near the interface between the electron transit layer 21 and the electron supply layer 22.

Figure 7B:
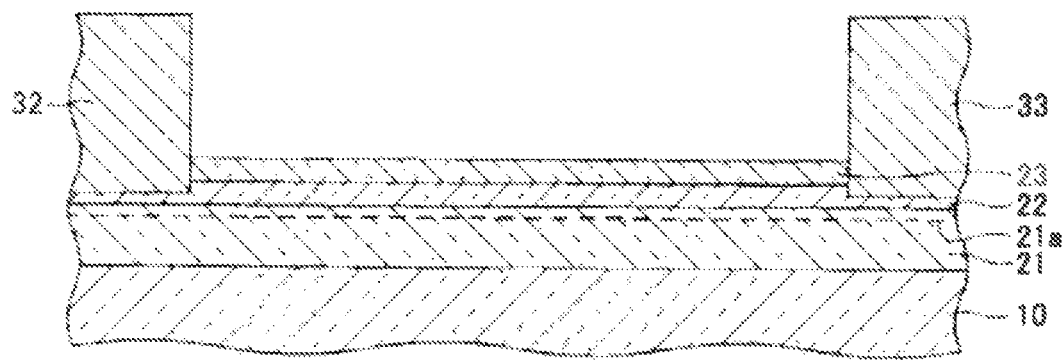

Next, as illustrated in FIG. 7B, a source electrode 32 and a drain electrode 33 are formed on the electron supply layer 22. In detail, a photoresist is applied onto the cap layer 23, and is photoexposed with an exposure device and developed to form a resist pattern (not illustrated) having openings in the regions where the source electrode 32 and the drain electrode 33 will be formed. Thereafter, the cap layer 23 exposed from the resist pattern is removed by a technique such as dry etching to expose the electron supply layer 22. Thereafter, the resist pattern is removed with an agent such as an organic solvent. Further, the photoresist is applied again onto the electron supply layer 22 and the cap layer 23, and is photoexposed with an exposure device and developed to form a resist pattern (not illustrated). The resist pattern formed in this process has openings in the regions where the source electrode 32 and the drain electrode 33 will be formed, and the openings of the resist pattern are disposed in the regions where the electron supply layer 22 is exposed. Thereafter, a metal film is formed by vacuum deposition, and the whole structure is soaked in an agent such as an organic solvent to remove the resist pattern and the metal film disposed on the resist pattern. The remaining metal film defines the source electrode 32 and the drain electrode 33 on the electron supply layer 22.

Figure 7C:
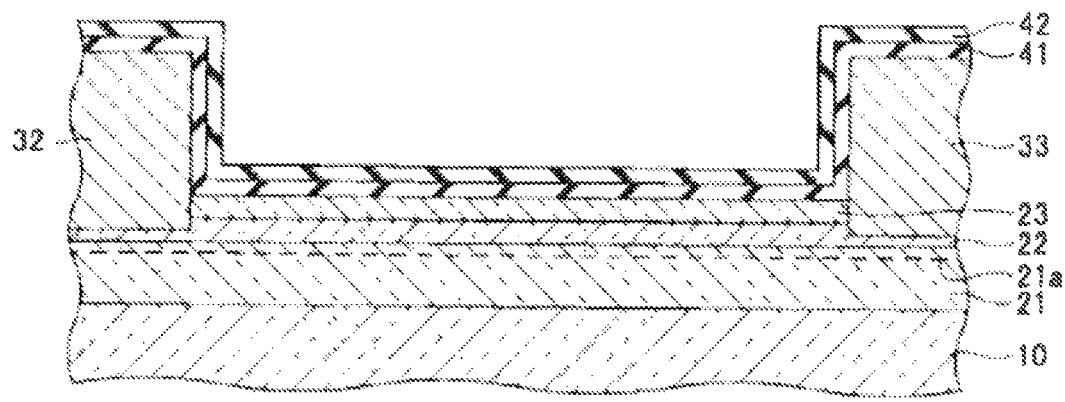

Next, as illustrated in FIG. 7C, a first insulating layer 41 and a second insulating layer 42 are stacked on the cap layer 23 by a technique such as chemical vapor deposition (CVD). In this embodiment, the first insulating layer 41 is formed by depositing a SiN film with a film thickness of approximately 40 nm on the cap layer 23, and the second insulating layer 42 is formed by depositing a SiON film with a film thickness of approximately 20 nm on the first insulating layer 41.

Figure 8A:
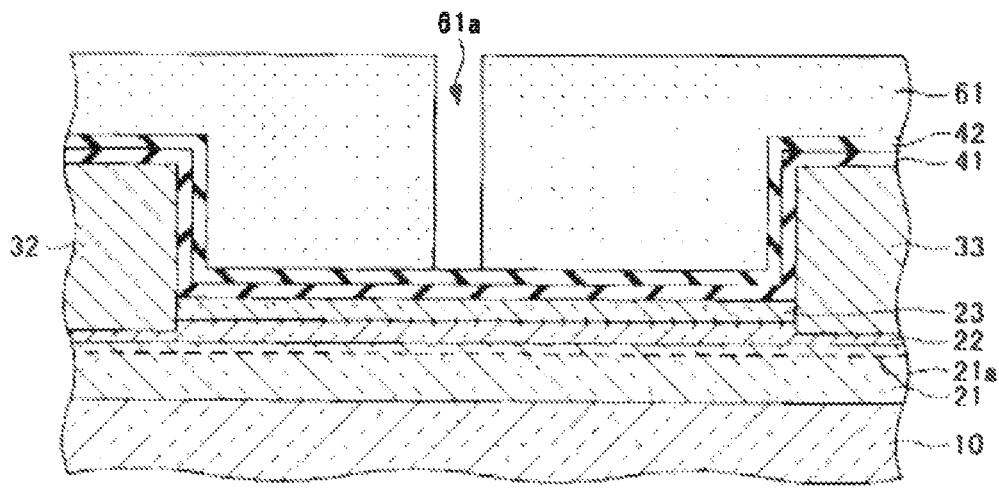
FIGS. 8A to 8C are views (2) illustrating steps in a method for manufacturing the semiconductor device in the first embodiment.

Next, as illustrated in FIG. 8A, a resist pattern 61 is formed on the second insulating layer 42, the resist pattern 61 having an opening 61a that reaches a central area of the region where a gate electrode 31 will be formed. In detail, a photoresist is applied onto the second insulating layer 42, and is photoexposed with an exposure device and developed to form a resist pattern 61 having an opening 61a reaching a central area of the region where a gate electrode 31 will be formed.

Figure 8B:
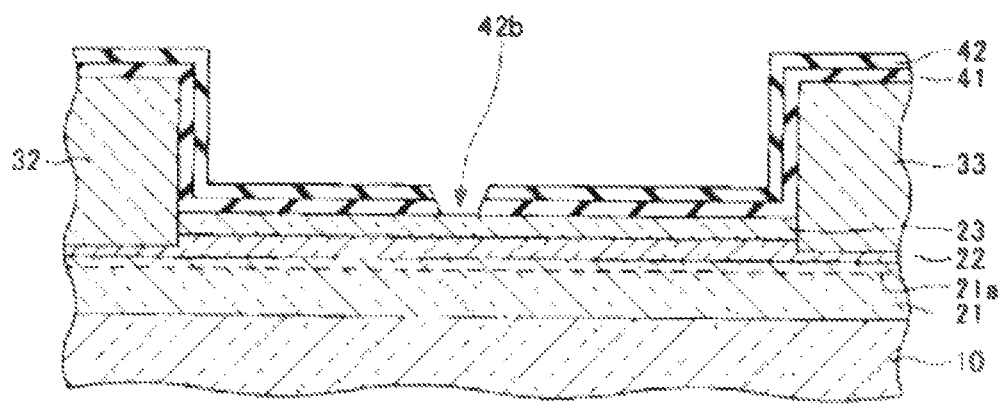

Next, as illustrated in FIG. 8B, the second insulating layer 42 and the first insulating layer 41 in the opening 61a of the resist pattern 61 are removed by etching to form an opening 42b, and thereafter the resist pattern 61 is removed with an agent such as an organic solvent. In detail, the second insulating layer 42 and the first insulating layer 41 in the opening 61a of the resist pattern 61 are treated by a combination of dry etching and wet etching such that the opening 42b is tapered with the diameter upwardly increasing from the substrate 10 side. At the bottom of the opening 42b thus formed, the cap layer 23 is exposed.

Figure 8C:
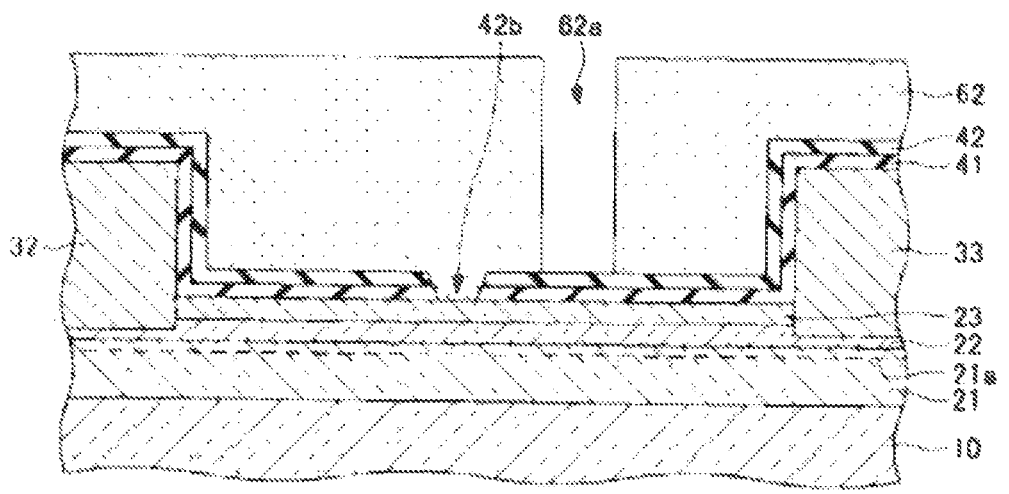

Next, as illustrated in FIG. 8C, a resist pattern 62 is formed on the second insulating layer 42, the resist pattern 62 having an opening 62a that reaches the region where an end portion 31a of the gate electrode 31 will be formed. In detail, a photoresist is applied onto the second insulating layer 42, and is photoexposed with an exposure device and developed to form a resist pattern 62 having an opening 62a reaching the region where an end portion 31a of the gate electrode 31 will be formed.

Figure 9A:
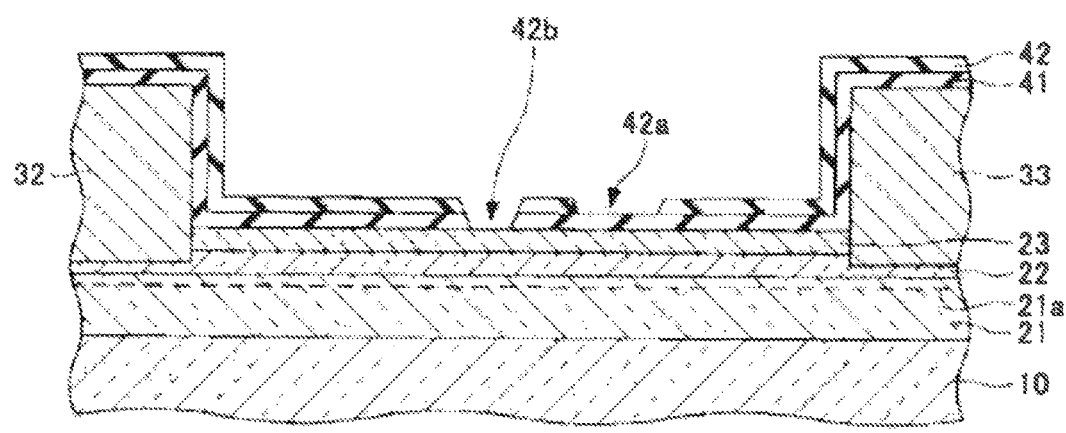
FIGS. 9A and 9B are views (3) illustrating steps in a method for manufacturing the semiconductor device in the first embodiment.

Next, as illustrated in FIG. 9A, the second insulating layer 42 in the opening 62a of the resist pattern 62 is removed by etching to form an opening 42a, and thereafter the resist pattern 62 is removed with an agent such as an organic solvent. In detail, the second insulating layer 42 in the opening 62a of the resist pattern 62 is removed by dry etching or wet etching to form an opening 42a. Because only the first insulating layer 41 is disposed in the region where there is the opening 42a, the thickness of the whole insulating layer is smaller than the other regions excluding the opening 42a and the opening 42b in which the first insulating layer 41 and the second insulating layer 42 are stacked one on top of the other.

Figure 9B:
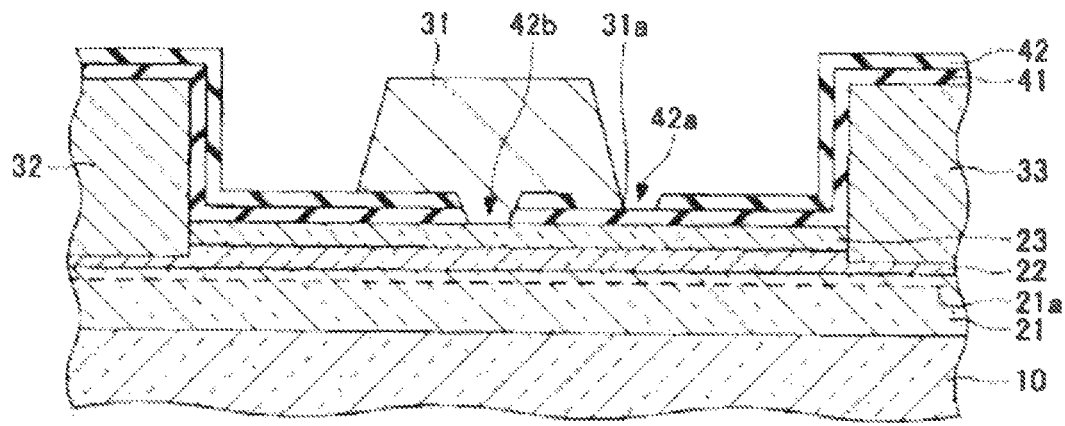

Next, as illustrated in FIG. 9B, the gate electrode 31 is formed on the second insulating layer 42. In detail, a photoresist is applied onto the surface such as the second insulating layer 42, and is photoexposed with an exposure device and developed to form a resist pattern (not illustrated) having an opening in the region where the gate electrode 31 will be formed. Thereafter, a metal film is formed by vacuum deposition, and the whole structure is soaked in an agent such as an organic solvent to remove the resist pattern and the metal film disposed on the resist pattern. The remaining metal film defines the gate electrode 31 on the second insulating layer 42.

The gate electrode 31 formed in the above manner buries the opening 42b, and the end portion 31a of the gate electrode 31 on the drain electrode 33 side is disposed on the first insulating layer 41 in the opening 42a.

The semiconductor devices in the present embodiment may be manufactured in the manner described above.

Second Embodiment

Semiconductor Devices

Figure 10:
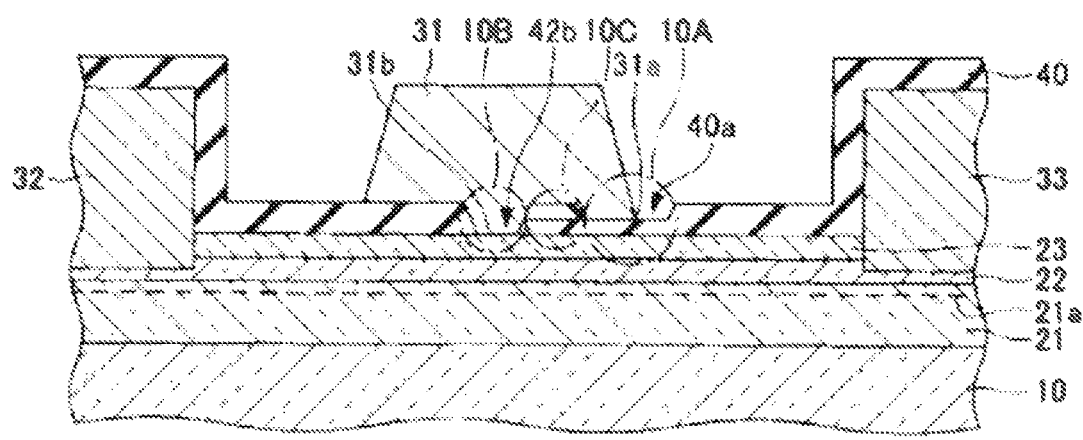
FIG. 10 is a view illustrating a structure of a semiconductor device in a second embodiment.

Next, semiconductor devices in the second embodiment will be described. In the semiconductor device in this embodiment, as illustrated in FIG. 10, layers such as a buffer layer, which are not illustrated, are disposed on a substrate 10, and an electron transit layer 21, an electron supply layer 22, and a cap layer 23 are sequentially stacked on the buffer layer. As a result, a 2DEG 21a is generated in the electron transit layer 21 near the interface between the electron transit layer 21 and the electron supply layer 22. The substrate 10 is made of such a material as silicon, silicon carbide or sapphire. The buffer layer, which is not illustrated, is a film including, for example, AlN. The electron transit layer 21 is made of GaN, the electron supply layer 22 is made of AlGaN, and the cap layer 23 is made of GaN.

The cap layer 23 has been removed from the regions where a source electrode 32 and a drain electrode 33 are disposed, and the source electrode 32 and the drain electrode 33 are formed on the electron supply layer 22 exposed by the removal of the cap layer 23. Further, an insulating layer 40 including SiN is disposed on the cap layer 23. The insulating layer 40 is formed of a material including any of, for example, SiN, SiON, $SiO_2$, AlN, $Al_2O_3$ and $Ta_2O_5$, and is preferably made of a nitride.

In the region where a gate electrode 31 is disposed, the insulating layer 40 has been partly removed to form a groove 40a in an area enclosed by an alternate long and short dash line 10A on which an end portion 31a of the gate electrode 31 on the drain electrode 33 side is disposed. Consequently, the thickness here is smaller than the other portion. In the region where the gate electrode 31 is disposed, a central area enclosed by an alternate long and short dash line 10B has been cleared of the insulating layer 40 such that an opening 40b is tapered with the diameter upwardly increasing from the substrate 10 side. In the region where the gate electrode 31 is disposed, the insulating layer 40 is allowed to remain in the area enclosed by an alternate long and short dash line 10C between the groove 40a accommodating the end portion 31a of the gate electrode 31 on the drain electrode 33 side, and the central opening 40b, for purposes such as increasing the voltage resistance and reducing the leak current.

Thus, in the present embodiment, the insulating layer 40 has a larger thickness in its portion enclosed by the alternate long and short dash line 10A, namely, the portion on which the end portion 31a of the gate electrode 31 on the drain electrode 33 side is disposed, than in the portion enclosed by the alternate long and short dash line 10B, namely, the portion in which the central opening 40b is disposed. Further, the insulating layer 40 has a smaller thickness under the groove 40a enclosed by the alternate long and short dash line 10A than in the other portion excluding the groove 40a. That is, the insulating layer 40 has a smaller thickness under the groove 40a enclosed by the alternate long and short dash line 10A on which the end portion 31a of the gate electrode 31 on the drain electrode 33 side is disposed, than in the area enclosed by the alternate long and short dash line 10C between the groove 40a and the opening 40b.

The end portion 31a of the gate electrode 31 on the drain electrode 33 side is disposed on the groove 40a of the insulating layer 40. Further, the gate electrode 31 is disposed on the cap layer 23 in the opening 40b that has been exposed by the removal of the insulating layer 40. This portion of the gate electrode 31 that is disposed on the cap layer 23 will be sometimes written as the Schottky connection portion 31b.

In this embodiment, the above configuration makes it possible to increase the threshold voltage in the end portion 31a of the gate electrode 31 on the drain electrode 33 side and thereby to reduce the concentration of an electric field.

(Semiconductor Device Manufacturing Method)

Next, a method for manufacturing the semiconductor device in this embodiment will be described based on FIGS. 11A to 13B.

Figure 11A:
FIGS. 11A to 11C are views (1) illustrating steps in a method for manufacturing the semiconductor device in the second embodiment.

First, as illustrated in FIG. 11A, a buffer layer, which is not illustrated, is formed on a substrate 10 and, on the buffer layer, an electron transit layer 21, an electron supply layer 22 and a cap layer 23 are sequentially formed by epitaxial growth. In this embodiment, the buffer layer, which is not illustrated, the electron transit layer 21, the electron supply layer 22 and the cap layer 23 are epitaxially grown by MOVPE. The substrate 10 used herein is a silicon substrate, and the buffer layer, which is not illustrated, is a film including, for example, AlN. The electron transit layer 21 is made of GaN, the electron supply layer 22 is made of AlGaN, and the cap layer 23 is made of GaN. As a result, a 2DEG 21a is generated in the electron transit layer 21 near the interface between the electron transit layer 21 and the electron supply layer 22.

Figure 11B:
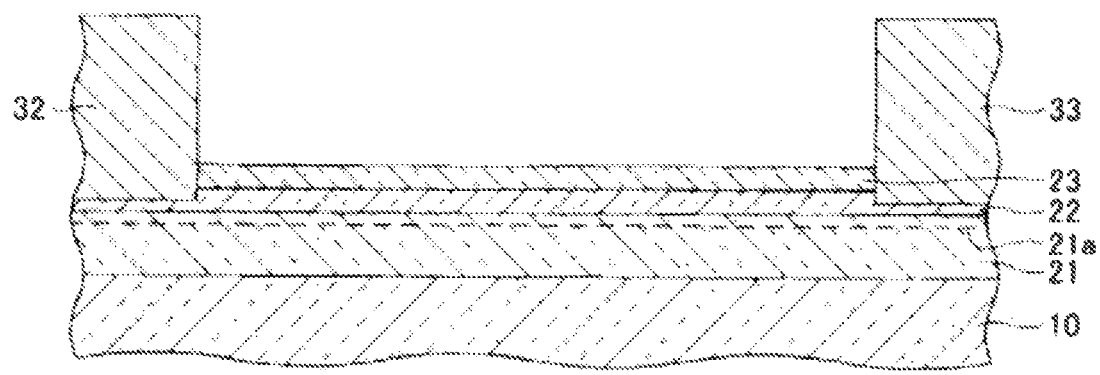

Next, as illustrated in FIG. 11B, a source electrode 32 and a drain electrode 33 are formed on the electron supply layer 22. In detail, a photoresist is applied onto the cap layer 23, and is photoexposed with an exposure device and developed to form a resist pattern (not illustrated) having openings in the regions where the source electrode 32 and the drain electrode 33 will be formed. Thereafter, the cap layer 23 exposed from the resist pattern is removed by a technique such as dry etching to expose the electron supply layer 22. Thereafter, the resist pattern is removed with an agent such as an organic solvent. Further, the photoresist is applied again onto the electron supply layer 22 and the cap layer 23, and is photoexposed with an exposure device and developed to form a resist pattern (not illustrated). The resist pattern formed in this process has openings in the regions where the source electrode 32 and the drain electrode 33 will be formed, and the openings of the resist pattern are disposed in the regions where the electron supply layer 22 is exposed. Thereafter, a metal film is formed by vacuum deposition, and the whole structure is soaked in an agent such as an organic solvent to remove the resist pattern and the metal film disposed on the resist pattern. The remaining metal film defines the source electrode 32 and the drain electrode 33 on the electron supply layer 22.

Figure 11C:
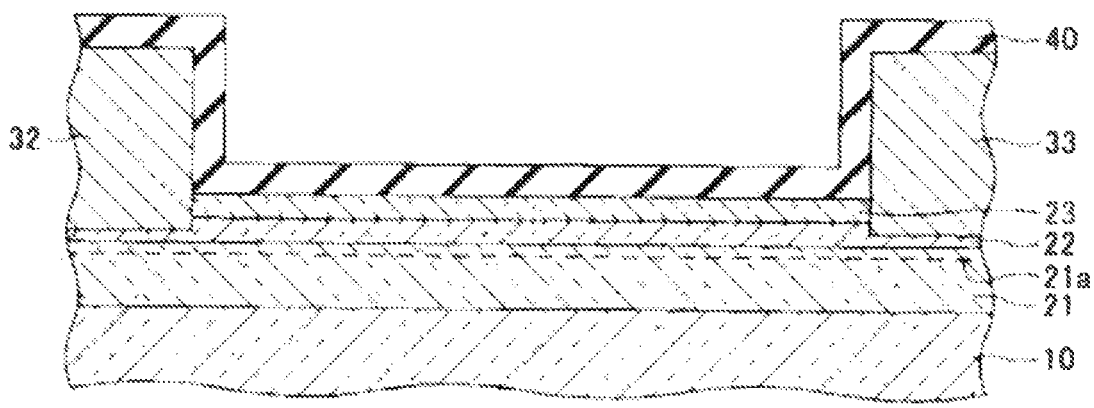

Next, as illustrated in FIG. 11C, an insulating layer 40 is formed on the cap layer 23 by a technique such as CVD. In this embodiment, the insulating layer 40 is formed by depositing a SiN film with a film thickness of approximately 60 nm on the cap layer 23.

Figure 12A:
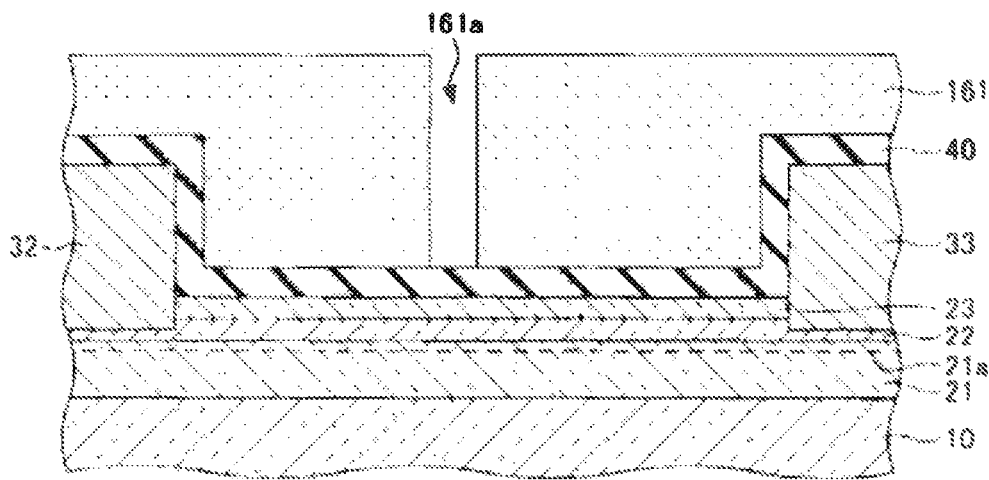
FIGS. 12A to 12C are views (2) illustrating steps in a method for manufacturing the semiconductor device in the second embodiment.

Next, as illustrated in FIG. 12A, a resist pattern 161 is formed on the insulating layer 40, the resist pattern 161 having an opening 161a that reaches a central area of the region where a gate electrode 31 will be formed. In detail, a photoresist is applied onto the insulating layer 40, and is photoexposed with an exposure device and developed to form a resist pattern 161 having an opening 161a reaching a central area of the region where a gate electrode 31 will be formed.

Figure 12B:
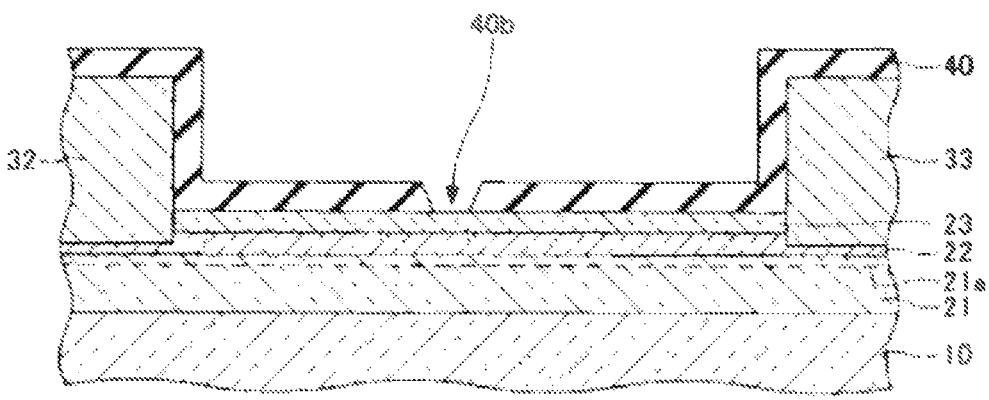

Next, as illustrated in FIG. 12B, the insulating layer 40 in the opening 161a of the resist pattern 161 is removed by etching to form an opening 40b, and thereafter the resist pattern 161 is removed with an agent such as an organic solvent. In detail, the insulating layer 40 in the opening 161a of the resist pattern 161 is treated by a combination of dry etching and wet etching such that the opening 40b is tapered with the diameter upwardly increasing. At the bottom of the opening 40b thus formed, the cap layer 23 is exposed.

Figure 12C:
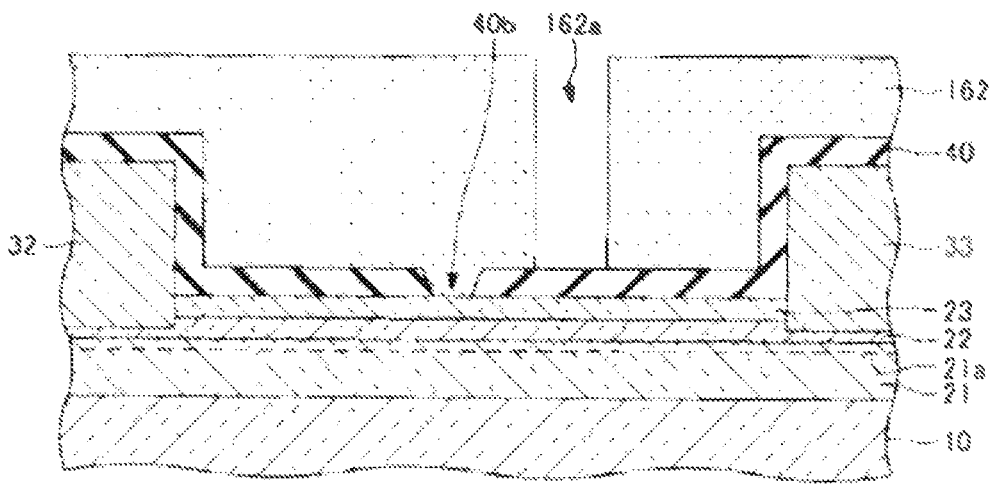

Next, as illustrated in FIG. 12C, a resist pattern 162 is formed on the insulating layer 40, the resist pattern 162 having an opening 162a that reaches the region where an end portion 31a of the gate electrode 31 will be formed. In detail, a photoresist is applied onto the insulating layer 40, and is photoexposed with an exposure device and developed to form a resist pattern 162 having an opening 162a that reaches the region where an end portion 31a of the gate electrode 31 will be formed.

Figure 13A:
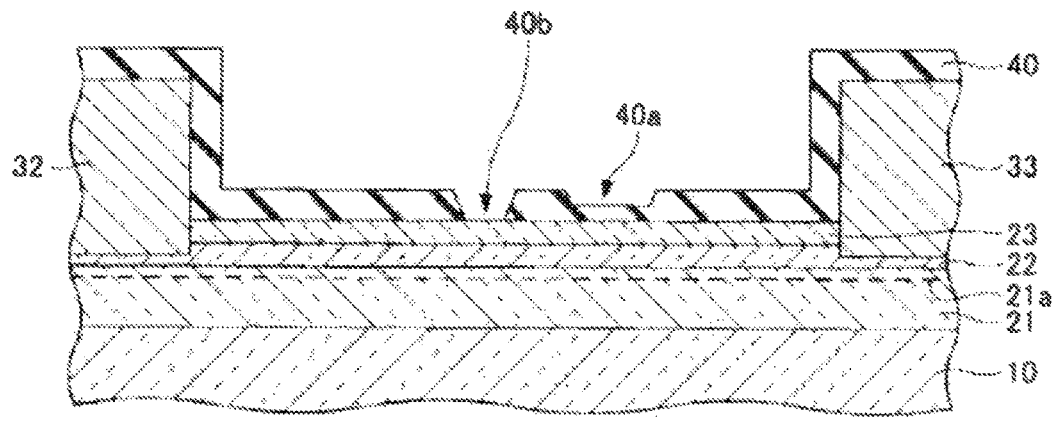
FIGS. 13A and 13B are views (3) illustrating steps in a method for manufacturing the semiconductor device in the second embodiment.

Next, as illustrated in FIG. 13A, the insulating layer 40 in the opening 162a of the resist pattern 162 is etched to a prescribed thickness to form a groove 40a, and thereafter the resist pattern 162 is removed with an agent such as an organic solvent. In detail, the insulating layer 40 in the opening 162a of the resist pattern 162 is dry etched or wet etched to a prescribed thickness to form a groove 40a. The insulating layer 40 has a smaller thickness under the groove 40a than in the other regions excluding the groove 40a and the opening 40b.

Figure 13B:
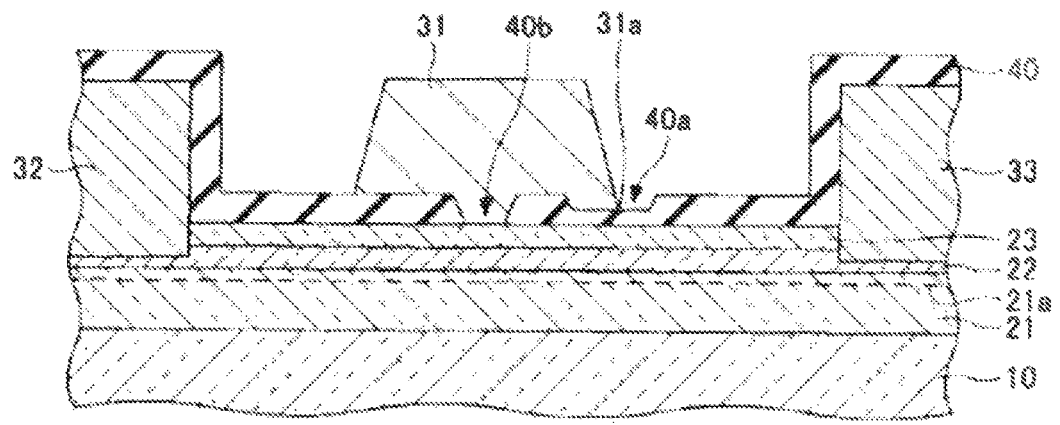

Next, as illustrated in FIG. 13B, the gate electrode 31 is formed on the insulating layer 40. In detail, a photoresist is applied onto the surface such as the insulating layer 40, and is photoexposed with an exposure device and developed to form a resist pattern (not illustrated) having an opening in the region where the gate electrode 31 will be formed. Thereafter, a metal film is formed by vacuum deposition, and the whole structure is soaked in an agent such as an organic solvent to remove the resist pattern and the metal film disposed on the resist pattern. The remaining metal film defines the gate electrode 31 on the insulating layer 40.

The gate electrode 31 formed in the above manner buries the opening 40b, and the end portion 31a of the gate electrode 31 on the drain electrode 33 side is disposed on the groove 40a in the insulating layer 40.

The semiconductor devices in the present embodiment may be manufactured in the manner described above. The configurations other than those described above are the same as in the first embodiment.

Third Embodiment

Semiconductor Devices

Figure 14:
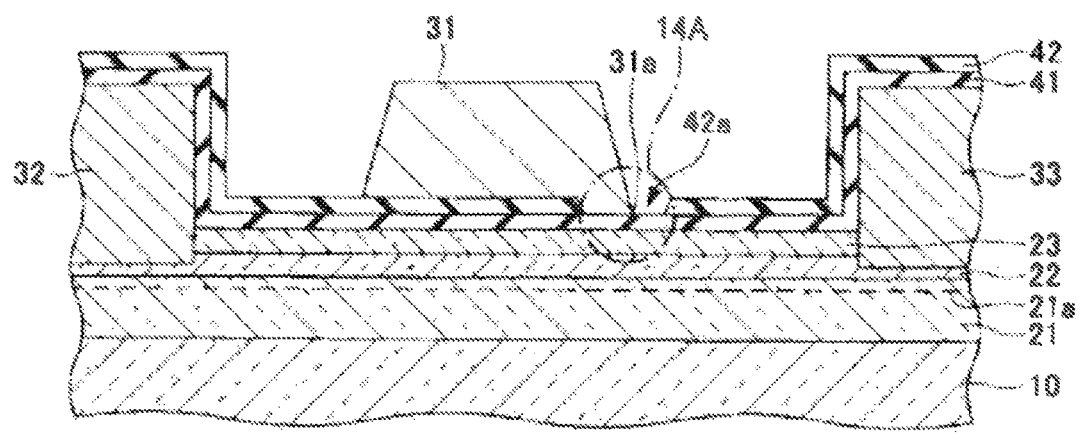
FIG. 14 is a view illustrating a structure of a semiconductor device in a third embodiment.

Next, semiconductor devices in the third embodiment will be described. In the semiconductor device in this embodiment, as illustrated in FIG. 14, layers such as a buffer layer, which are not illustrated, are disposed on a substrate 10, and an electron transit layer 21, an electron supply layer 22, and a cap layer 23 are sequentially stacked on the buffer layer. As a result, a 2DEG 21a is generated in the electron transit layer 21 near the interface between the electron transit layer 21 and the electron supply layer 22. The substrate 10 is made of such a material as silicon, silicon carbide or sapphire. The buffer layer, which is not illustrated, is a film including, for example, AlN. The electron transit layer 21 is made of GaN, the electron supply layer 22 is made of AlGaN, and the cap layer 23 is made of GaN.

The cap layer 23 has been removed from the regions where a source electrode 32 and a drain electrode 33 are disposed, and the source electrode 32 and the drain electrode 33 are formed on the electron supply layer 22 exposed by the removal of the cap layer 23. Further, a first insulating layer 41 including SiN and a second insulating layer 42 including SiON are stacked on the cap layer 23. The first insulating layer 41 and the second insulating layer 42 are formed of materials including any of, for example, SiN, SION, $SiO_2$, AlN, $Al_2O_3$ and $Ta_2O_5$. The first insulating layer 41 and the second insulating layer 42 are preferably made of different materials. Further, the first insulating layer 41 is preferably made of a nitride and the second insulating layer 42 is preferably made of an oxide or an oxynitride.

In the region where a gate electrode 31 is disposed, the second insulating layer 42 has been locally removed to form an opening 42a in an area enclosed by an alternate long and short dash line 14A on which an end portion 31a of the gate electrode 31 on the drain electrode 33 side is disposed. As a result, only the first insulating layer 41 remains in this area. Except in the opening 42a, the gate electrode 31 is disposed on the stack of the first insulating layer 41 and the second insulating layer 42.

Thus, in this embodiment, the end portion 31a of the gate electrode 31 on the drain electrode 33 side is disposed on the first insulating layer 41 in the opening 42a.

In this embodiment, the above configuration makes it possible to increase the threshold voltage in the end portion 31a of the gate electrode 31 on the drain electrode 33 side and thereby to reduce the concentration of an electric field at the end portion 31a of the gate electrode 31 on the drain electrode 33 side. For purposes such as increasing the voltage resistance and reducing the leak current, the gate electrode 31 is disposed on the second insulating layer 42 except in the opening 42a.

(Semiconductor Device Manufacturing Method)

Next, a method for manufacturing the semiconductor device in this embodiment will be described based on FIGS. 15A to 16C.

Figure 15A:
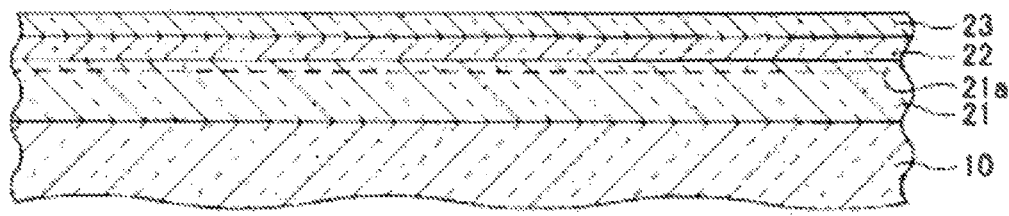
FIGS. 15A to 15C are views (1) illustrating steps in a method for manufacturing the semiconductor device in the third embodiment.

First, as illustrated in FIG. 15A, a buffer layer, which is not illustrated, is formed on a substrate 10 and, on the buffer layer formed, an electron transit layer 21, an electron supply layer 22 and a cap layer 23 are sequentially formed by epitaxial growth. In this embodiment, the buffer layer, which is not illustrated, the electron transit layer 21, the electron supply layer 22 and the cap layer 23 are epitaxially grown by MOVPE. The substrate 10 used herein is a silicon substrate, and the buffer layer, which is not illustrated, is a film including, for example, AlN. The electron transit layer 21 is made of GaN, the electron supply layer 22 is made of AlGaN, and the cap layer 23 is made of GaN. As a result, a 2DEG 21a is generated in the electron transit layer 21 near the interface between the electron transit layer 21 and the electron supply layer 22.

Figure 15B:
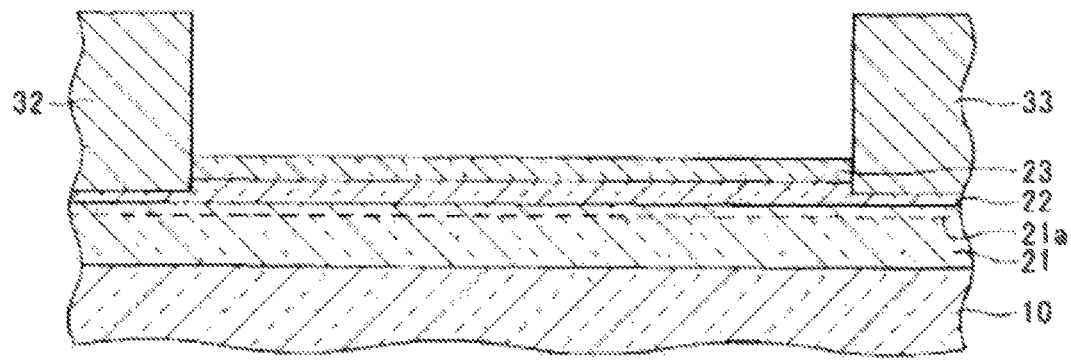

Next, as illustrated in FIG. 15B, a source electrode 32 and a drain electrode 33 are formed on the electron supply layer 22. In detail, a photoresist is applied onto the cap layer 23, and is photoexposed with an exposure device and developed to form a resist pattern (not illustrated) having openings in the regions where the source electrode 32 and the drain electrode 33 will be formed. Thereafter, the cap layer 23 exposed from the resist pattern is removed by a technique such as dry etching to expose the electron supply layer 22. Thereafter, the resist pattern is removed with an agent such as an organic solvent. Further, the photoresist is applied again onto the electron supply layer 22 and the cap layer 23, and is photoexposed with an exposure device and developed to form a resist pattern (not illustrated). The resist pattern formed in this process has openings in the regions where the source electrode 32 and the drain electrode 33 will be formed, and the openings of the resist pattern are disposed in the regions where the electron supply layer 22 is exposed. Thereafter, a metal film is formed by vacuum deposition, and the whole structure is soaked in an agent such as an organic solvent to remove the resist pattern and the metal film disposed on the resist pattern. The remaining metal film defines the source electrode 32 and the drain electrode 33 on the electron supply layer 22.

Figure 15C:
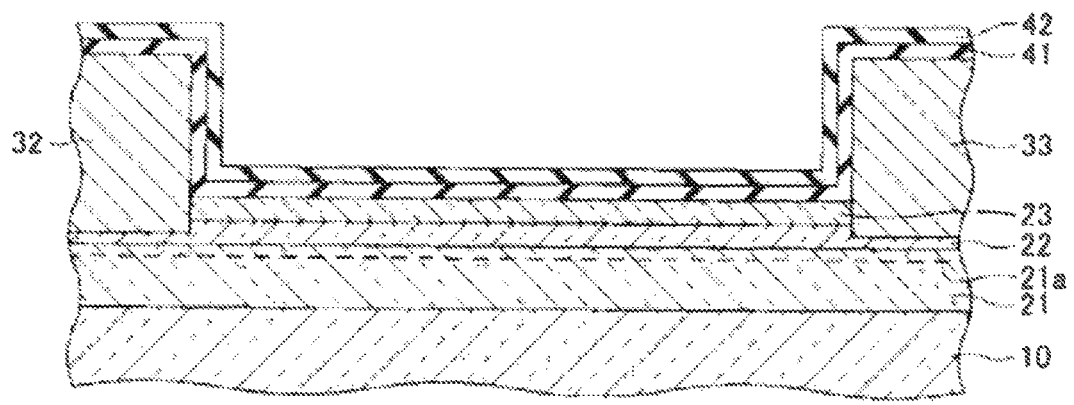

Next, as illustrated in FIG. 15C, a first insulating layer 41 and a second insulating layer 42 are stacked on the cap layer 23 by a technique such as CVD. In this embodiment, the first insulating layer 41 is formed by depositing a SiN film with a film thickness of approximately 40 nm on the cap layer 23, and the second insulating layer 42 is formed by depositing a SiON film with a film thickness of approximately 20 nm on the first insulating layer 41.

Figure 16A:
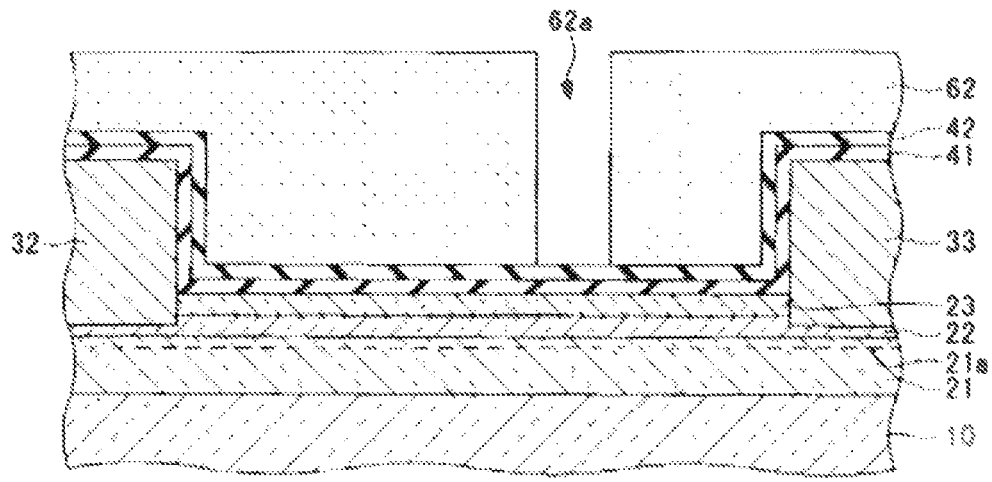
FIGS. 16A to 16C are views (2) illustrating steps in a method for manufacturing the semiconductor device in the third embodiment.

Next, as illustrated in FIG. 16A, a resist pattern 62 is formed on the second insulating layer 42, the resist pattern 62 having an opening 62a that reaches the region where an end portion 31a of the gate electrode 31 will be formed. In detail, a photoresist is applied onto the second insulating layer 42, and is photoexposed with an exposure device and developed to form a resist pattern 62 having an opening 62a reaching the region where an end portion 31a of the gate electrode 31 will be formed.

Figure 16B:
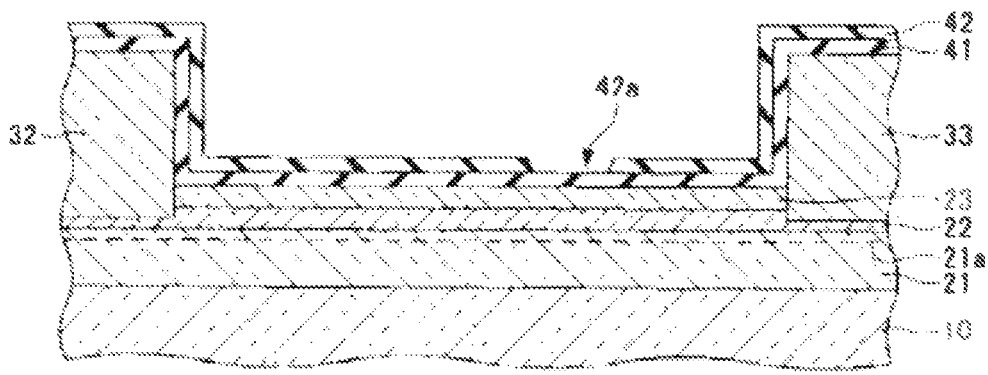

Next, as illustrated in FIG. 16B, the second insulating layer 42 in the opening 62a of the resist pattern 62 is removed by etching to form an opening 42a, and thereafter the resist pattern 62 is removed with an agent such as an organic solvent. In detail, the second insulating layer 42 in the opening 62a of the resist pattern 62 is removed by dry etching or wet etching to form an opening 42a. Because only the first insulating layer 41 is disposed in the region where there is the opening 42a, the thickness of the whole insulating layer is smaller than the other regions excluding the opening 42a in which the first insulating layer 41 and the second insulating layer 42 are stacked one on top of the other.

Figure 16C:
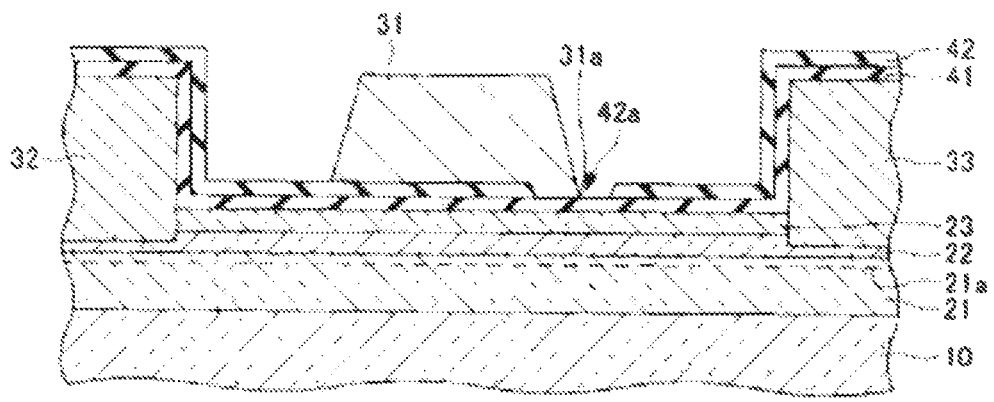

Next, as illustrated in FIG. 16C, the gate electrode 31 is formed on the second insulating layer 42. In detail, a photoresist is applied onto the surface such as the second insulating layer 42, and is photoexposed with an exposure device and developed to form a resist pattern (not illustrated) having an opening in the region where the gate electrode 31 will be formed. Thereafter, a metal film is formed by vacuum deposition, and the whole structure is soaked in an agent such as an organic solvent to remove the resist pattern and the metal film disposed on the resist pattern. The remaining metal film defines the gate electrode 31 on the second insulating layer 42.

As a result, the gate electrode 31 is formed such that the end portion 31a on the drain electrode 33 side is disposed on the first insulating layer 41 in the opening 42a and the other portion is disposed on the stack of the first insulating layer 41 and the second insulating layer 42 except in the opening 42a. The configurations other than those described above are the same as in the first embodiment.

Fourth Embodiment

Semiconductor Devices

Figure 17:
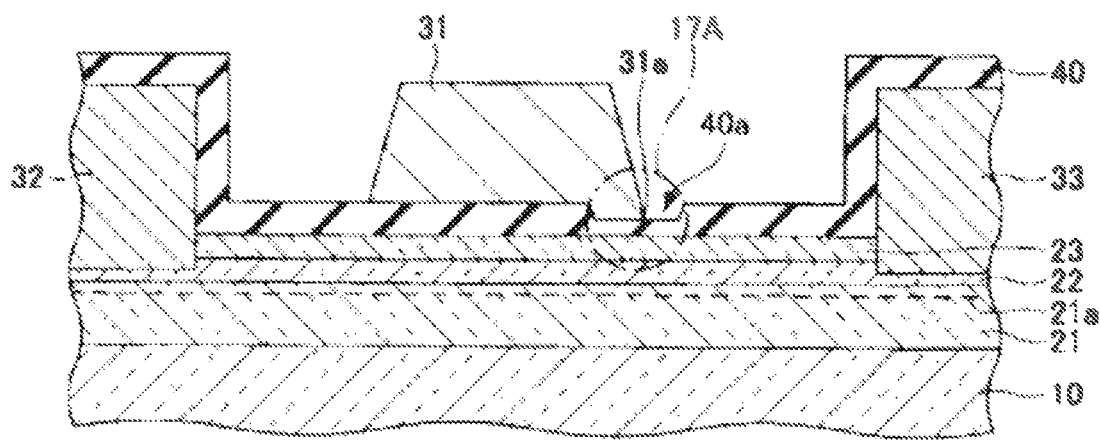
FIG. 17 is a view illustrating a structure of a semiconductor device in a fourth embodiment.

Next, semiconductor devices in the fourth embodiment will be described. In the semiconductor device in this embodiment, as illustrated in FIG. 17, layers such as a buffer layer, which are not illustrated, are disposed on a substrate 10, and an electron transit layer 21, an electron supply layer 22, and a cap layer 23 are sequentially stacked on the buffer layer. As a result, a 2DEG 21a is generated in the electron transit layer 21 near the interface between the electron transit layer 21 and the electron supply layer 22. The substrate 10 is made of such a material as silicon, silicon carbide or sapphire. The buffer layer, which is not illustrated, is a film including, for example, AlN. The electron transit layer 21 is made of GaN, the electron supply layer 22 is made of AlGaN, and the cap layer 23 is made of GaN.

The cap layer 23 has been removed from the regions where a source electrode 32 and a drain electrode 33 are disposed, and the source electrode 32 and the drain electrode 33 are formed on the electron supply layer 22 exposed by the removal of the cap layer 23. Further, an insulating layer 40 including SiN is disposed on the cap layer 23. The insulating layer 40 is formed of a material including any of, for example, SiN, SiON, $SiO_2$, AlN, $Al_2O_3$ and $Ta_2O_5$, and is preferably made of a nitride.

In the region where a gate electrode 31 is disposed, the insulating layer 40 has been partly removed to form a groove 40a in an area enclosed by an alternate long and short dash line 17A on which an end portion 31a of the gate electrode 31 on the drain electrode 33 side is disposed. Consequently, the thickness here is smaller than the other portion. In the region where the gate electrode 31 is disposed, the insulating layer 40 is allowed to remain intact in the region except the groove 40a.

The end portion 31a of the gate electrode 31 on the drain electrode 33 side is disposed on the groove 40a in the insulating layer 40. In this embodiment, the above configuration makes it possible to increase the threshold voltage in the end portion 31a of the gate electrode 31 on the drain electrode 33 side and thereby to reduce the concentration of an electric field.

(Semiconductor Device Manufacturing Method)

Next, a method for manufacturing the semiconductor device in this embodiment will be described based on FIGS. 18A to 19C.

Figure 18A:
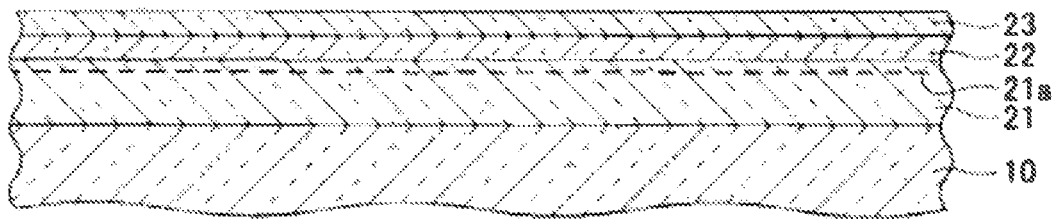
FIGS. 18A to 18C are views (1) illustrating steps in a method for manufacturing the semiconductor device in the fourth embodiment.

First, as illustrated in FIG. 18A, a buffer layer, which is not illustrated, is formed on a substrate 10 and, on the buffer layer, an electron transit layer 21, an electron supply layer 22 and a cap layer 23 are sequentially formed by epitaxial growth. In this embodiment, the buffer layer, which is not illustrated, the electron transit layer 21, the electron supply layer 22 and the cap layer 23 are epitaxially grown by MOVPE. The substrate 10 used herein is a silicon substrate, and the buffer layer, which is not illustrated, is a film including, for example, AlN. The electron transit layer 21 is made of GaN, the electron supply layer 22 is made of AlGaN, and the cap layer 23 is made of GaN. As a result, a 2DEG 21a is generated in the electron transit layer 21 near the interface between the electron transit layer 21 and the electron supply layer 22.

Figure 18B:
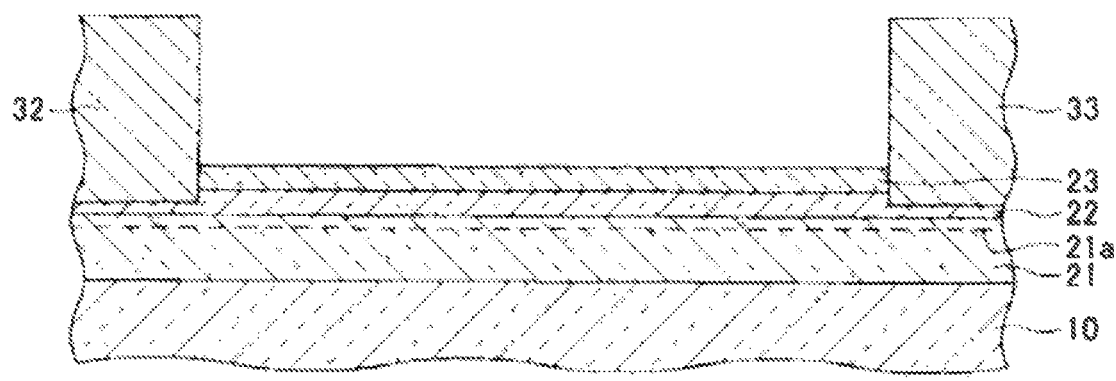

Next, as illustrated in FIG. 18B, a source electrode 32 and a drain electrode 33 are formed on the electron supply layer 22. In detail, a photoresist is applied onto the cap layer 23, and is photoexposed with an exposure device and developed to form a resist pattern (not illustrated) having openings in the regions where the source electrode 32 and the drain electrode 33 will be formed. Thereafter, the cap layer 23 exposed from the resist pattern is removed by a technique such as dry etching to expose the electron supply layer 22. Thereafter, the resist pattern is removed with an agent such as an organic solvent. Further, the photoresist is applied again onto the electron supply layer 22 and the cap layer 23, and is photoexposed with an exposure device and developed to form a resist pattern (not illustrated). The resist pattern formed in this process has openings in the regions where the source electrode 32 and the drain electrode 33 will be formed, and the openings of the resist pattern are disposed in the regions where the electron supply layer 22 is exposed. Thereafter, a metal film is formed by vacuum deposition, and the whole structure is soaked in an agent such as an organic solvent to remove the resist pattern and the metal film disposed on the resist pattern. The remaining metal film defines the source electrode 32 and the drain electrode 33 on the electron supply layer 22.

Figure 18C:
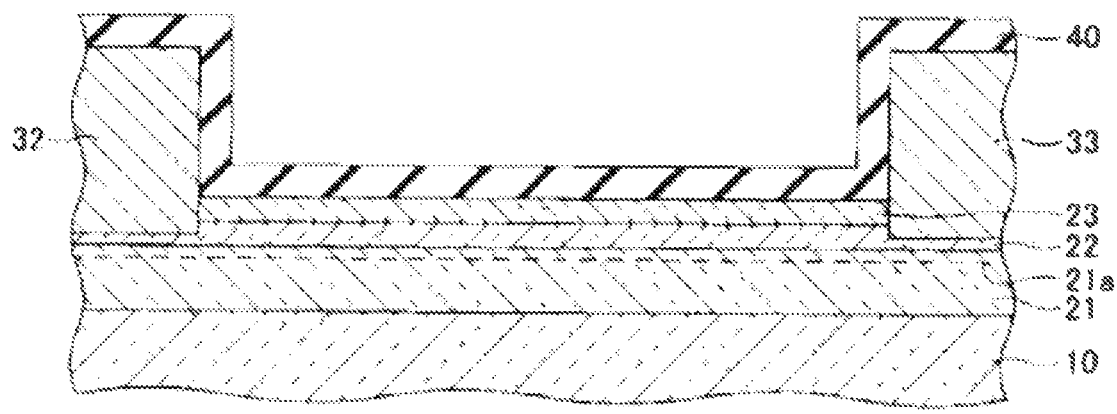

Next, as illustrated in FIG. 18C, an insulating layer 40 is formed on the cap layer 23 by a technique such as CVD. In this embodiment, the insulating layer 40 is formed by depositing a SiN film with a film thickness of approximately 60 nm on the cap layer 23.

Figure 19A:
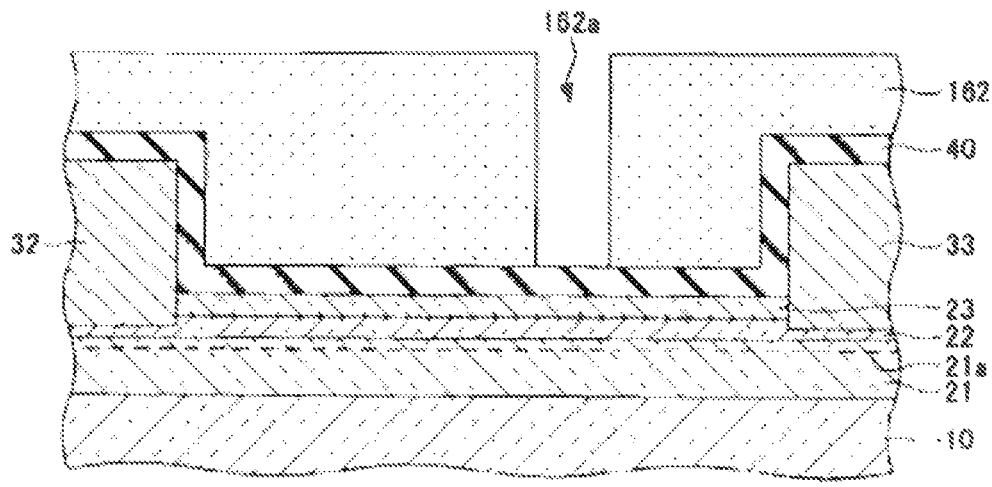
FIGS. 19A to 19C are views (2) illustrating steps in a method for manufacturing the semiconductor device in the fourth embodiment.

Next, as illustrated in FIG. 19A, a resist pattern 162 is formed on the insulating layer 40, the resist pattern 162 having an opening 162a that reaches the region where an end portion 31a of the gate electrode 31 will be formed. In detail, a photoresist is applied onto the insulating layer 40, and is photoexposed with an exposure device and developed to form a resist pattern 162 having an opening 162a that reaches the region where an end portion 31a of the gate electrode 31 will be formed.

Figure 19B:
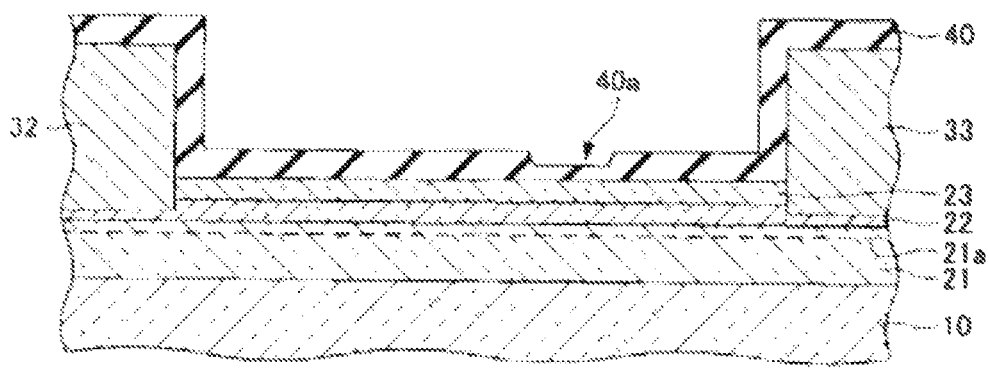

Next, as illustrated in FIG. 19B, the insulating layer 40 in the opening 162a of the resist pattern 162 is etched to a prescribed thickness to form a groove 40a, and thereafter the resist pattern 162 is removed with an agent such as an organic solvent. In detail, the insulating layer 40 in the opening 162a of the resist pattern 162 is dry etched or wet etched to a prescribed thickness to form a groove 40a. The insulating layer 40 has a smaller thickness under the groove 40a than in the other regions excluding the groove 40a.

Figure 19C:
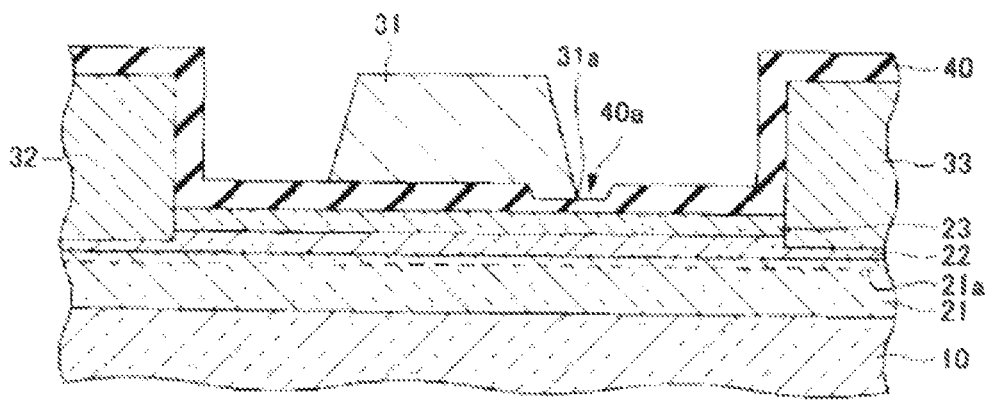

Next, as illustrated in FIG. 19C, the gate electrode 31 is formed on the insulating layer 40. In detail, a photoresist is applied onto the surface such as the insulating layer 40, and is photoexposed with an exposure device and developed to form a resist pattern (not illustrated) having an opening in the region where the gate electrode 31 will be formed. Thereafter, a metal film is formed by vacuum deposition, and the whole structure is soaked in an agent such as an organic solvent to remove the resist pattern and the metal film disposed on the resist pattern. The remaining metal film defines the gate electrode 31 on the insulating layer 40.

As a result, the gate electrode 31 is formed such that the end portion 31a of the gate electrode 31 on the drain electrode 33 side is disposed on the groove 40a in the insulating layer 40.

The semiconductor devices in the present embodiment may be manufactured in the manner described above. The configurations other than those described above are the same as in the first embodiment.

Fifth Embodiment

Next, the fifth embodiment will be described. In this embodiment, the semiconductor device has the same structure as described in any of the first embodiment to the fourth embodiment, except that openings or grooves are disposed not only in the end portion 31a of the gate electrode 31 on the drain electrode 33 side but also in an end portion on the source electrode 32 side. Specifically, the semiconductor devices in this embodiment will be described based on FIGS. 20A to 21B.

Figure 20A:
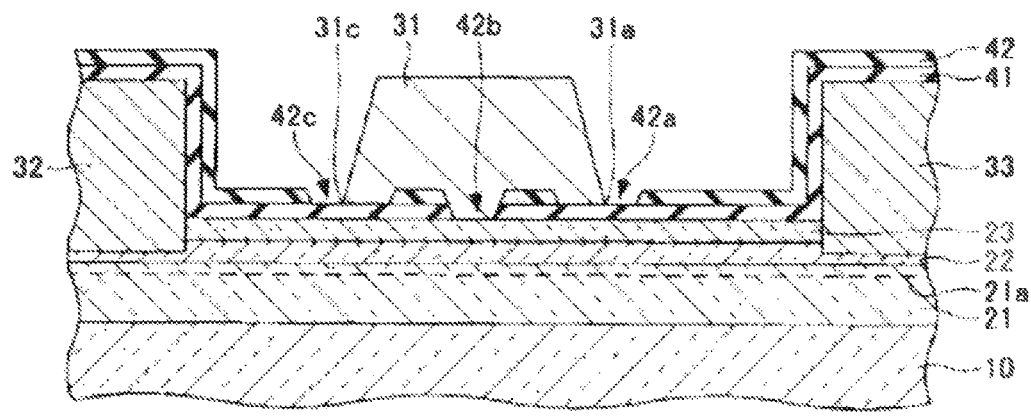
FIGS. 20A and 20B are views (1) illustrating structures of semiconductor devices in a fifth embodiment.

As illustrated in FIG. 20A, the semiconductor device in this embodiment has the structure of the semiconductor device in the first embodiment, except that the second insulating layer 42 in the region where an end portion 31c of the gate electrode 31 on the source electrode 32 side is disposed has been removed to form an opening 42c. The opening 42c may be formed by the same steps as the opening 42a. In this embodiment, the opening 42a is sometimes written as the first opening, the opening 42c as the second opening, and the other opening 42b as the third opening.

Figure 20B:
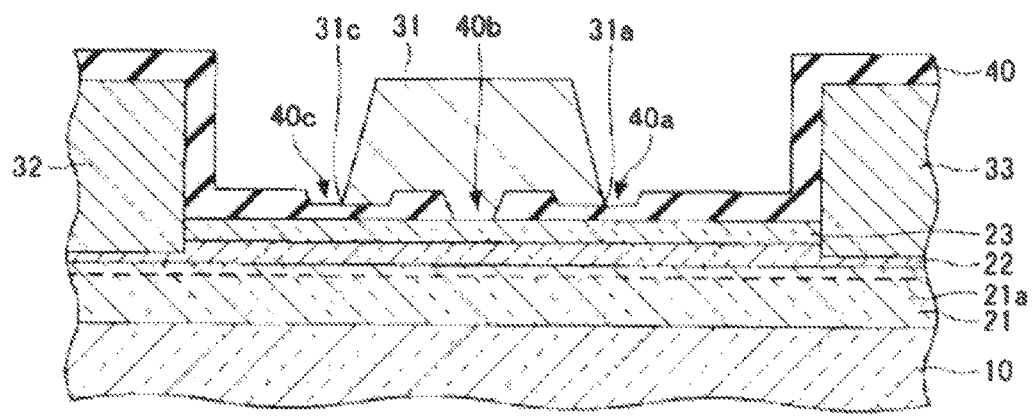

Further, as illustrated in FIG. 20B, the semiconductor device in this embodiment has the structure of the semiconductor device in the second embodiment, except that the insulating layer 40 in the region where an end portion 31c of the gate electrode 31 on the source electrode 32 side is disposed has been partly removed to form a groove 40c. The groove 40c may be formed by the same steps as the groove 40a. In this embodiment, for convenience, the groove 40a is sometimes written as the first opening, the groove 40c as the second opening, and the opening 40b as the third opening.

Figure 21A:
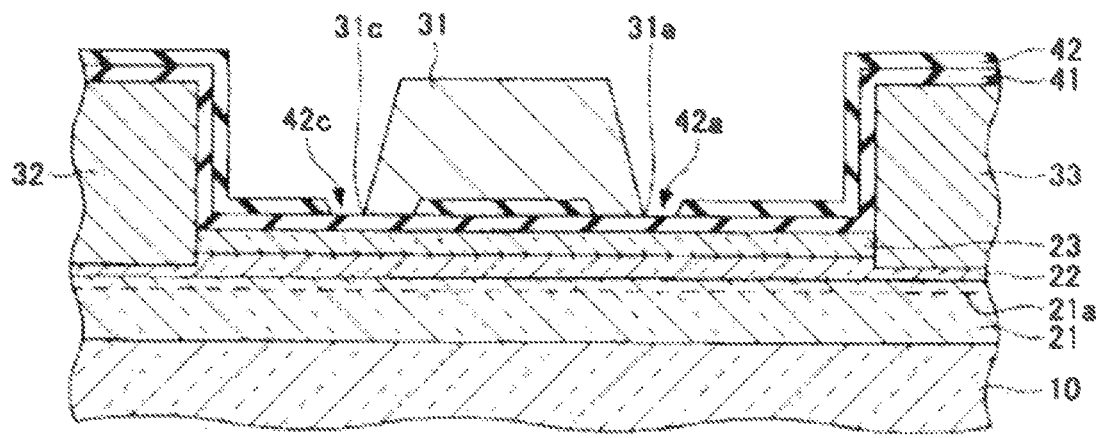
FIGS. 21A and 21B are views (2) illustrating structures of semiconductor devices in the fifth embodiment.

Further, as illustrated in FIG. 21A, the semiconductor device in this embodiment has the structure of the semiconductor device in the third embodiment, except that the second insulating layer 42 in the region where an end portion 31c of the gate electrode 31 on the source electrode 32 side is disposed has been removed to form an opening 42c.

Figure 21B:
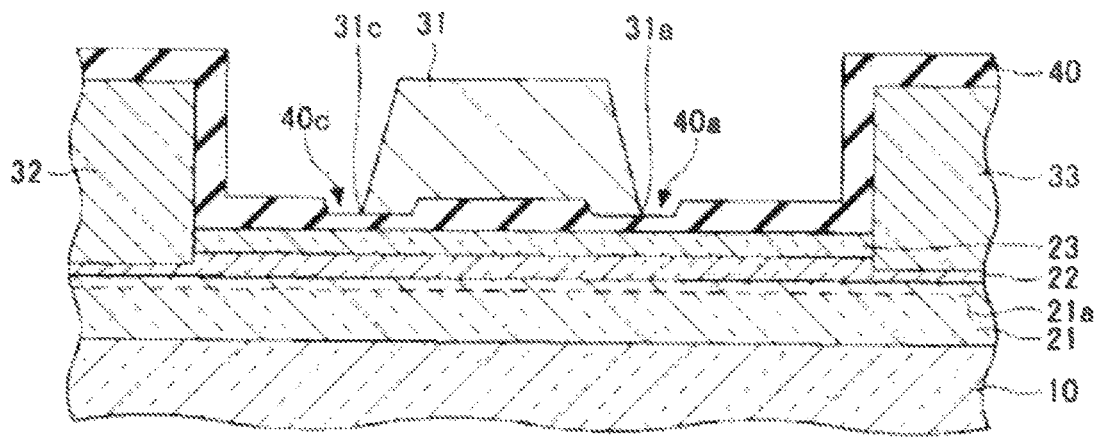

Further, as illustrated in FIG. 21B, the semiconductor device in this embodiment has the structure of the semiconductor device in the fourth embodiment, except that the insulating layer 40 in the region where an end portion 31c of the gate electrode 31 on the source electrode 32 side is disposed has been partly removed to form a groove 40c.

Sixth Embodiment

Next, the sixth embodiment will be described. In this embodiment, the semiconductor device has the same structure as described in any of the first embodiment to the fourth embodiment, except that the opening or the groove in which the end portion 31a of the gate electrode 31 on the drain electrode 33 side is disposed is extended to the vicinity of the drain electrode 33. Specifically, the semiconductor devices in this embodiment will be described based on FIGS. 22A to 23B.

Figure 22A:
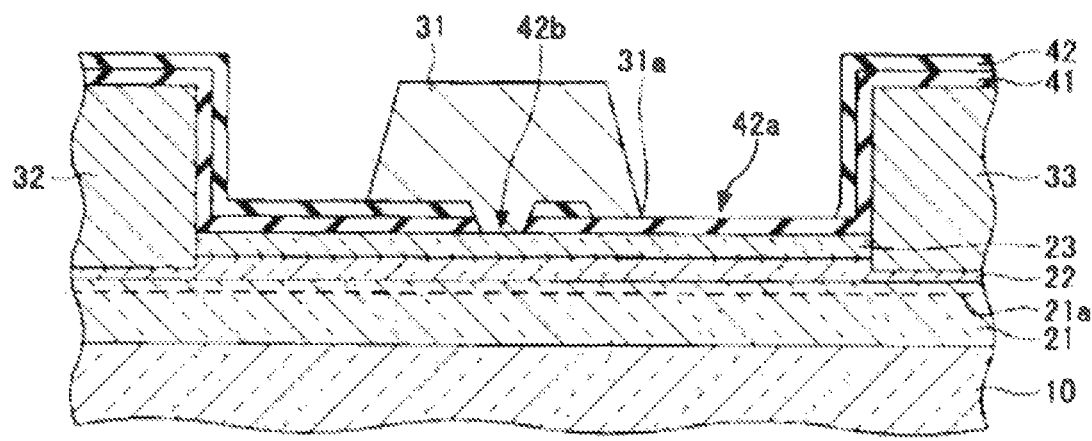
FIGS. 22A and 22B are views (1) illustrating structures of semiconductor devices in a sixth embodiment.

As illustrated in FIG. 22A, the semiconductor device in this embodiment has the structure of the semiconductor device in the first embodiment, except that the opening 42a in which the end portion 31a of the gate electrode 31 on the drain electrode 33 side is disposed is extended to the vicinity of the drain electrode 33.

Figure 22B:
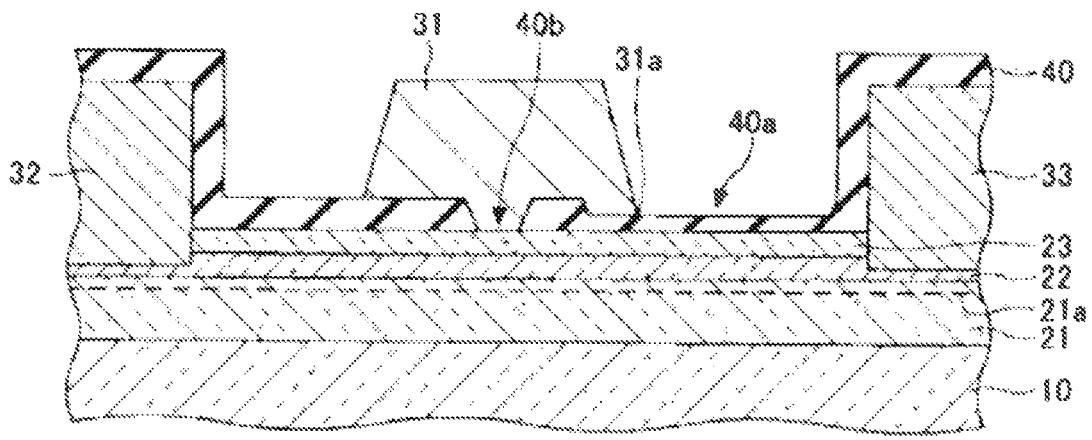

Further, as illustrated in FIG. 22B, the semiconductor device in this embodiment has the structure of the semiconductor device in the second embodiment, except that the groove 40a on which the end portion 31a of the gate electrode 31 on the drain electrode 33 side is disposed is extended to the vicinity of the drain electrode 33.

Figure 23A:
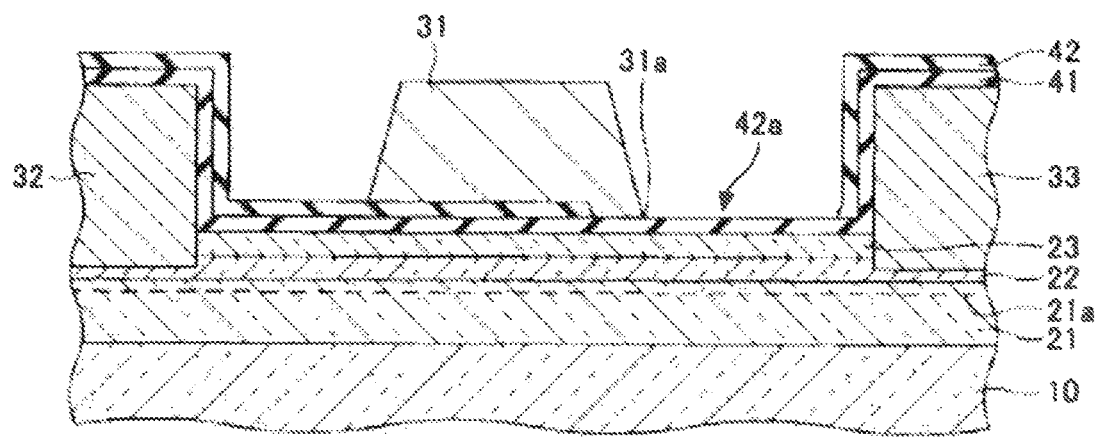
FIGS. 23A and 23B are views (2) illustrating structures of semiconductor devices in the sixth embodiment.

Further, as illustrated in FIG. 23A, the semiconductor device in this embodiment has the structure of the semiconductor device in the third embodiment, except that the opening 42a in which the end portion 31a of the gate electrode 31 on the drain electrode 33 side is disposed is extended to the vicinity of the drain electrode 33.

Figure 23B:
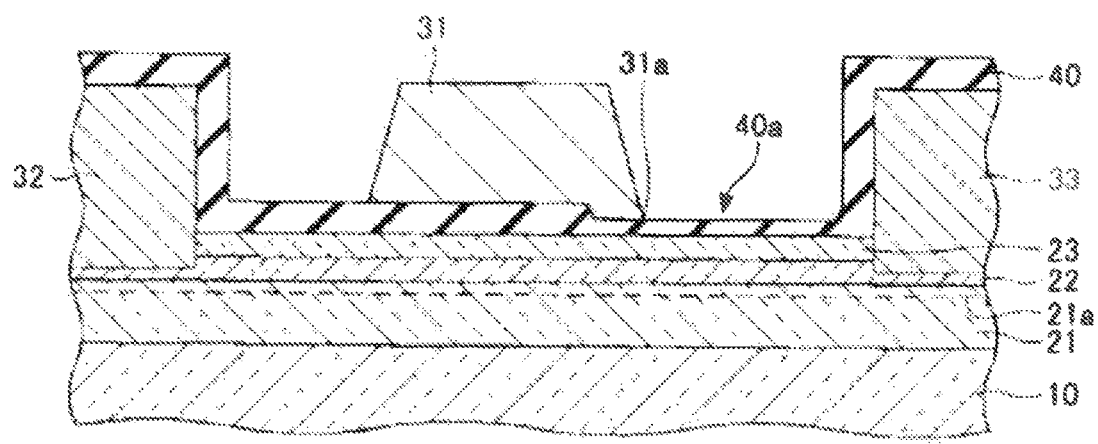

Further, as illustrated in FIG. 23B, the semiconductor device in this embodiment has the structure of the semiconductor device in the fourth embodiment, except that the groove 40a on which the end portion 31a of the gate electrode 31 on the drain electrode 33 side is disposed is extended to the vicinity of the drain electrode 33.

Seventh Embodiment

Next, the seventh embodiment will be described. The present embodiment is drawn to semiconductor devices, power supply units and high-frequency amplifiers.

(Semiconductor Devices)

Figure 24:
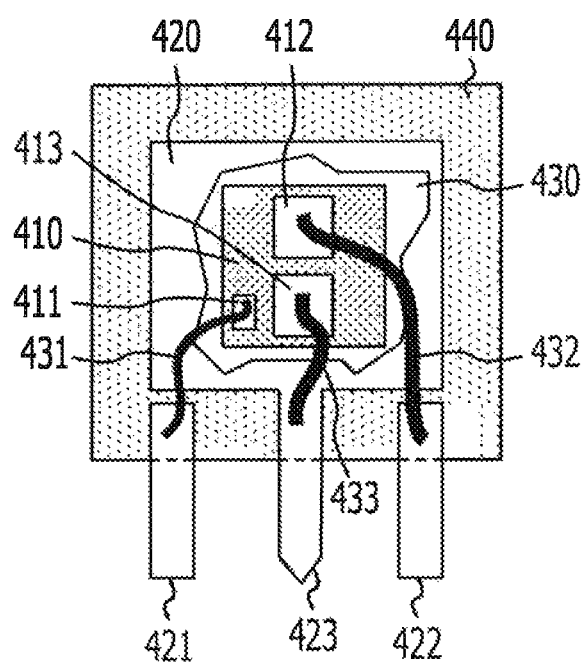
FIG. 24 is a view illustrating a semiconductor device in a seventh embodiment.

The semiconductor device in the present embodiment is a discrete package of the semiconductor device according to any of the first embodiment to the sixth embodiment. Such a discretely packaged semiconductor device will be described based on FIG. 24. FIG. 24 schematically illustrates the inside of the discretely packaged semiconductor device, and the arrangement of features such as electrodes differs from those described in the first embodiment to the sixth embodiment.

First, the semiconductor device manufactured in any of the first embodiment to the sixth embodiment is cut by a technique such as dicing to form a HEMT semiconductor chip 410 made of the GaN semiconductor materials. The semiconductor chip 410 is fixed onto a lead frame 420 with a die-attach adhesive 430 such as solder. The semiconductor chip 410 corresponds to the semiconductor device in any of the first embodiment to the sixth embodiment.

Next, a gate electrode 411 is connected to a gate lead 421 via a bonding wire 431; a source electrode 412 is connected to a source lead 422 via a bonding wire 432; and a drain electrode 413 is connected to a drain lead 423 via a bonding wire 433. The bonding wires 431, 432 and 433 are formed of a metal material such as Al. In the present embodiment, the gate electrode 411 is a gate electrode pad, and is connected to the gate electrode 31 in the semiconductor device according to any of the first embodiment to the sixth embodiment. Further, the source electrode 412 is a source electrode pad, and is connected to the source electrode 32 in the semiconductor device according to any of the first embodiment to the sixth embodiment. Furthermore, the drain electrode 413 is a drain electrode pad, and is connected to the drain electrode 33 in the semiconductor device according to any of the first embodiment to the sixth embodiment.

Next, the structure obtained above is sealed with a mold resin 440 by a transfer molding method. In this manner, a discretely packaged HEMT semiconductor device utilizing GaN semiconductor materials may be manufactured.

(PFC Circuits, Power Supply Units and High-Frequency Amplifiers)

Next, PFC circuits, power supply units and high-frequency amplifiers in the present embodiment will be described. The PFC circuits, the power supply units and the high-frequency amplifiers in this embodiment involve the semiconductor devices according to any of the first embodiment to the sixth embodiment.

(PFC Circuits)

The PFC circuits in the present embodiment will be described. The PFC circuit in this embodiment includes the semiconductor device according to any of the first embodiment to the sixth embodiment.

Figure 25:
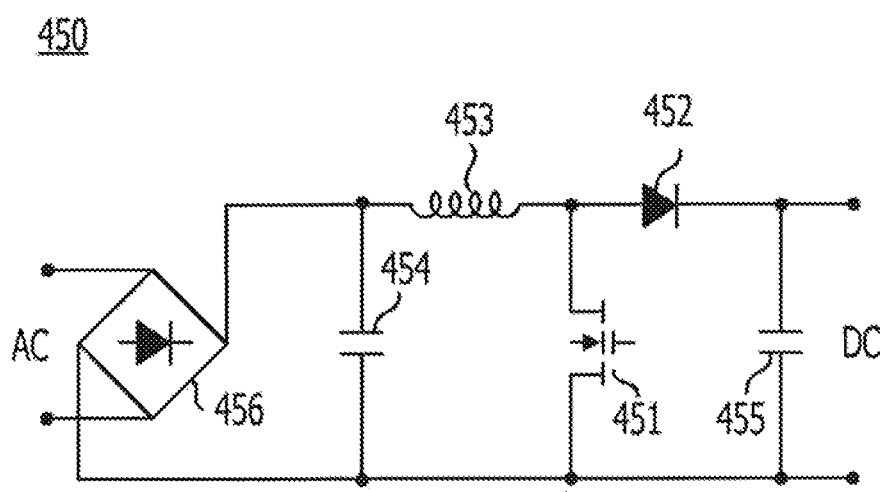
FIG. 25 is a circuit diagram illustrating a power factor correction (PFC) circuit in the seventh embodiment.

The PFC circuit in the present embodiment will be described based on FIG. 25. The PFC circuit 450 in this embodiment includes a switching element (transistor) 451, a diode 452, a choke coil 453, capacitors 454 and 455, a diode bridge 456, and an alternating-current source (not illustrated). The switching element 451 is a HEMT that is the semiconductor device according to any of the first embodiment to the sixth embodiment.

In the PFC circuit 450, the drain electrode of the switching element 451 is connected to an anode terminal of the diode 452 and one of the terminals of the choke coil 453. Further, the source electrode of the switching element 451 is connected to one of the terminals of the capacitor 454 and one of the terminals of the capacitor 455. The other terminal of the capacitor 454 is connected to the other terminal of the choke coil 453. The other terminal of the capacitor 455 is connected to a cathode terminal of the diode 452, and between the two terminals of the capacitor 454, the alternating-current source (not illustrated) is connected via the diode bridge 456. In this PFC circuit 450, direct current (DC) is output from between the two terminals of the capacitor 455.

(Power Supply Units)

Next, the power supply units in the present embodiment will be described. The power supply unit in this embodiment includes a HEMT that is the semiconductor device according to any of the first embodiment to the sixth embodiment.

Figure 26:
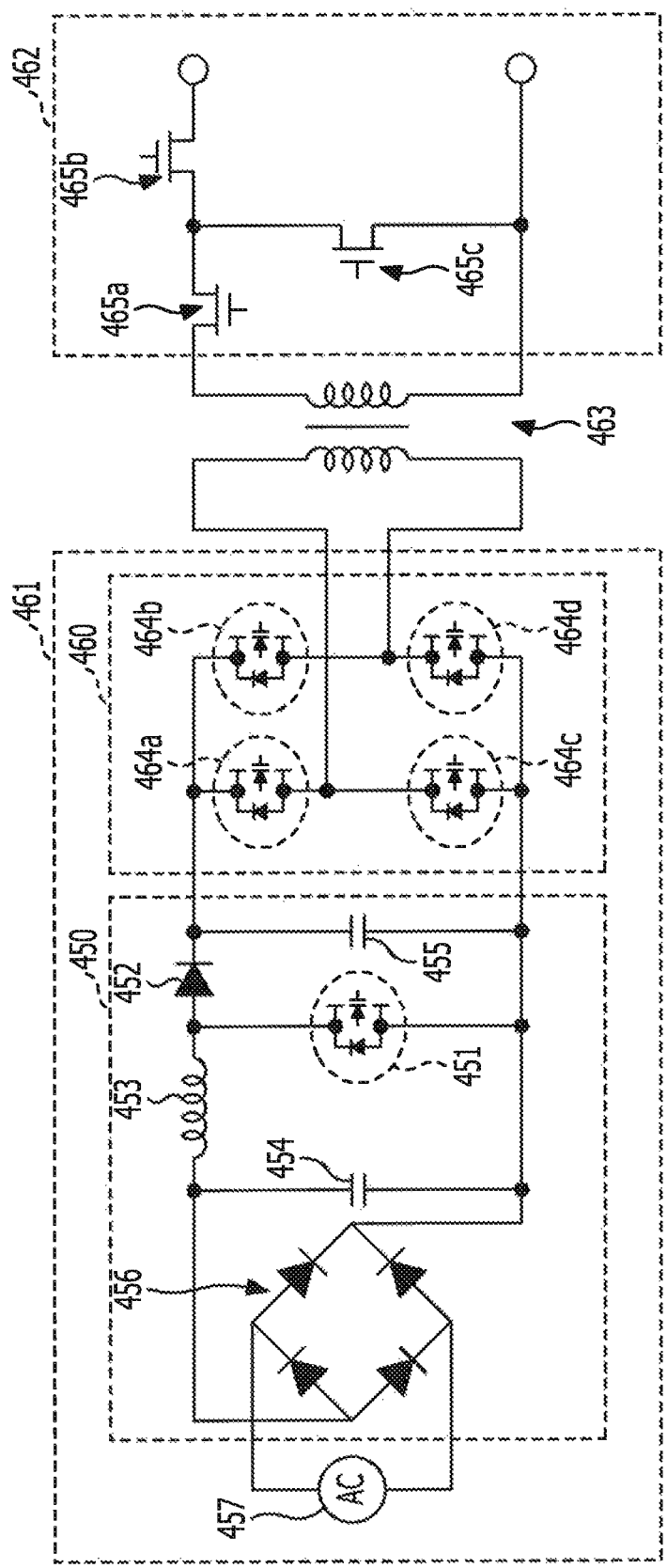
FIG. 26 is a circuit diagram illustrating a power supply unit in the seventh embodiment.

The power supply unit in the present embodiment will be described based on FIG. 26. The power supply unit in this embodiment has a structure including the aforementioned PFC circuit 450 in this embodiment.

The power supply unit in this embodiment includes a high-voltage primary circuit 461, a low-voltage secondary circuit 462, and a transformer 463 disposed between the primary circuit 461 and the secondary circuit 462.

The primary circuit 461 includes the PFC circuit 450 of the present embodiment described above, and an inverter circuit, for example, a full bridge inverter circuit 460, connected to the terminals of the capacitor 455 in the PFC circuit 450. The full bridge inverter circuit 460 has a plurality (four in this embodiment) of switching elements 464a, 464b, 464c and 464d. The secondary circuit 462 has a plurality (three in this embodiment) of switching elements 465a, 465b and 465c. An alternating-current source 457 is connected to the diode bridge 456.

In the present embodiment, the switching element 451 in the PFC circuit 450 in the primary circuit 461 is a HEMT that is the semiconductor device according to any of the first embodiment to the sixth embodiment. Further, the switching elements 464a, 464b, 464c and 464d in the full bridge inverter circuit 460 are HEMTs that are the semiconductor devices according to any of the first embodiment to the sixth embodiment. On the other hand, the switching elements 465a, 465b and 465c in the secondary circuit 462 may be usual structures such as MISFETs using silicon.

(High-Frequency Amplifiers)

Next, the high-frequency amplifiers in the present embodiment will be described. The high-frequency amplifier in this embodiment has a structure including a HEMT that is the semiconductor device according to any of the first embodiment to the sixth embodiment.

Figure 27:
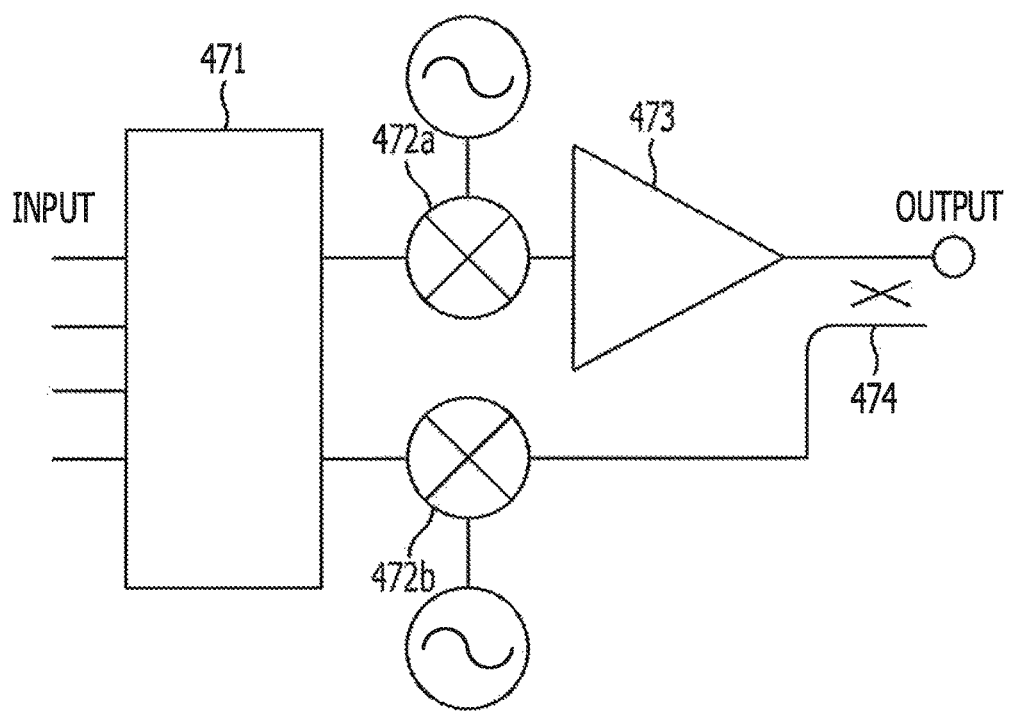
FIG. 27 is a view illustrating a structure of a high-power amplifier in the seventh embodiment.

The high-frequency amplifier in the present embodiment will be described based on FIG. 27. The high-frequency amplifier in this embodiment includes a digital predistortion circuit 471, mixers 472a and 472b, a power amplifier 473, and a directional coupler 474.

The digital predistortion circuit 471 is configured to compensate for the non-linear distortions of input signals. The mixer 472a is configured to mix the input signal whose non-linear distortion has been compensated for, with an alternating current signal. The power amplifier 473 is configured to amplify the input signal mixed with the alternating current signal, and includes a HEMT that is the semiconductor device according to any of the first embodiment to the sixth embodiment. The directional coupler 474 is configured to, for example, monitor the input signal and the output signal. In FIG. 27, the output signal may be mixed with an alternating current signal at the mixer 472b and the mixed signal may be supplied to the digital predistortion circuit 471 by, for example, the switching of a switch.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
   a substrate;
   nitride semiconductor layers formed over the substrate;
   a source electrode and a drain electrode formed over the nitride semiconductor layers;
   a first insulating layer formed over the nitride semiconductor layers, the source electrode and the drain electrode;
   a second insulating layer formed over the first insulating layer;
   a first opening formed between the source electrode and the drain electrode, the first opening penetrates the second insulating layer and the first insulating layer and exposes a surface of the nitride semiconductor layers;
   a second opening formed between the first opening and the drain electrode at a position apart from the first opening, the second opening penetrates the second insulating layer and exposes a surface of the first insulating layer; and
   a gate electrode formed between the source electrode and the drain electrode so as to bury the first opening and at least a portion of the second opening.

2. The semiconductor device according to claim 1, wherein
   the nitride semiconductor layers include
   a first semiconductor layer, and
   a second semiconductor layer over the first semiconductor layer.

3. The semiconductor device according to claim 2, wherein
   the first semiconductor layer is made of a material including GaN.

4. The semiconductor device according to claim 2, wherein
   the second semiconductor layer is made of a material including AlGaN.

5. The semiconductor device according to claim 2, further comprising:
   a third semiconductor layer formed between the second semiconductor layer and the second insulating layer.

6. The semiconductor device according to claim 5, wherein
   the third semiconductor layer is made of a material including GaN.

7. The semiconductor device according to claim 1, wherein
   the first insulating layer and the second insulating layer are each made of a material including one, or two or more selected from SiN, SiON, $SiO_2$, AlN, $Al_2O_3$, and $Ta_2O_5$.

8. The semiconductor device according to claim 7, wherein
   the first insulating layer and the second insulating layer are made of different materials.

9. The semiconductor device according to claim 7, wherein
the first insulating layer is made of a material using a nitride.

* * * * *